US012727342B2

(12) United States Patent
Jo et al.

(10) Patent No.: US 12,727,342 B2
(45) Date of Patent: Sep. 1, 2026

(54) DISPLAY APPARATUS INCLUDING MASK LAYER

(71) Applicant: Samsung Display Co., Ltd., Yongin-si (KR)

(72) Inventors: Yongseon Jo, Yongin-si (KR); Kwangwoo Park, Yongin-si (KR); Donghwan Shim, Yongin-si (KR); Eonjoo Lee, Yongin-si (KR); Jinyong Lee, Yongin-si (KR); Cheol Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 329 days.

(21) Appl. No.: 18/365,137

(22) Filed: Aug. 3, 2023

(65) Prior Publication Data

US 2024/0179961 A1 May 30, 2024

(30) Foreign Application Priority Data

Nov. 28, 2022 (KR) ........................ 10-2022-0162028

(51) Int. Cl.

*H10K 59/12* (2023.01)
*G09G 3/3233* (2016.01)
*H10K 59/124* (2023.01)
*H10K 77/10* (2023.01)

(52) U.S. Cl.

CPC ......... *H10K 59/124* (2023.02); *G09G 3/3233* (2013.01); *H10K 77/10* (2023.02); *H10K 77/111* (2023.02); *G09G 2300/0819* (2013.01); *G09G 2300/0842* (2013.01); *G09G 2300/0861* (2013.01)

(58) Field of Classification Search

CPC .... H10K 59/124; H10K 59/12; H10K 59/122; H10K 59/873; H10K 59/1213; H10K 50/844; H10K 77/10; H10K 77/111; G09G 3/3233

See application file for complete search history.

(56) References Cited

U.S. PATENT DOCUMENTS

| | | | |
|---|---|---|---|
| 8,816,344 | B2 | 8/2014 | Kwon et al. |
| 9,223,486 | B2 | 12/2015 | Shin et al. |
| 10,684,396 | B2 | 6/2020 | Kim et al. |
| 11,108,005 | B2 | 8/2021 | Sun et al. |
| 2019/0267440 | A1 | 8/2019 | Park et al. |
| 2020/0201391 | A1 | 6/2020 | Bai et al. |

(Continued)

FOREIGN PATENT DOCUMENTS

| | | | |
|---|---|---|---|
| CN | 113066824 A * | 7/2021 | ......... H10K 59/8731 |
| CN | 114122067 A * | 3/2022 | ........... H10D 86/441 |

(Continued)

*Primary Examiner* — Ida M Soward

(74) *Attorney, Agent, or Firm* — Womble Bond Dickinson (US) LLP

(57) ABSTRACT

There is provided a display apparatus including a mask layer having a plurality of openings, a substrate located below the mask layer and having a plurality of first grooves corresponding to the plurality of openings, an inorganic insulating layer located on the mask layer and having through holes corresponding to at least some of the plurality of openings, and an organic insulating layer located on the inorganic insulating layer and filling the through holes.

25 Claims, 27 Drawing Sheets

(56) References Cited

U.S. PATENT DOCUMENTS

2021/0151715 A1 5/2021 Lee et al.
2021/0280825 A1* 9/2021 Beon .................... H10K 50/844
2021/0359047 A1* 11/2021 Yoon .................... H10K 59/353
2021/0391407 A1* 12/2021 Yoon ..................... G06F 1/1626
2022/0068830 A1* 3/2022 Lee .................... H10K 59/1216
2022/0085326 A1* 3/2022 Chai .................... H10K 59/353
2022/0093705 A1 3/2022 Kim et al.
2022/0102455 A1 3/2022 Kim et al.
2022/0140063 A1 5/2022 Park et al.
2022/0157906 A1 5/2022 Bae et al.
2022/0199719 A1 6/2022 Ming et al.
2022/0376177 A1 11/2022 Yang et al.

FOREIGN PATENT DOCUMENTS

CN 114188372 A * 3/2022 ......... H10K 59/8791
KR 10-0686014 B1 2/2007
KR 10-1804359 B1 12/2017
KR 10-2018-0053446 A 5/2018
KR 10-1857564 B1 5/2018
KR 10-2019-0025800 A 3/2019
KR 10-1973163 B1 4/2019
KR 10-2019-0104091 A 9/2019
KR 10-2020-0003334 A 1/2020
KR 10-2020-0089380 A 7/2020
KR 10-2020-0113055 A 10/2020
WO WO-2020155570 A1 * 8/2020 ......... H10K 59/8731

* cited by examiner

FIG. 12

DISPLAY APPARATUS INCLUDING MASK LAYER

CROSS-REFERENCE TO RELATED APPLICATION

This application claims priority to, and the benefit of, Korean Patent Application No. 10-2022-0162028, filed on Nov. 28, 2022, in the Korean Intellectual Property Office, the disclosure of which is incorporated by reference herein in its entirety.

BACKGROUND

1. Field

One or more embodiments relate to a display apparatus having a low occurrence rate of defects due to external impact.

2. Description of the Related Art

In general, in display apparatuses, such as organic light-emitting display apparatuses, thin-film transistors are arranged in each (sub-)pixel to control the luminance of each (sub-)pixel. These thin-film transistors control the luminance of a corresponding (sub-)pixel according to a transmitted data signal, etc.

SUMMARY

However, in such an existing display apparatus, there may be a relatively high probability that defects will occur due to impact from the outside.

One or more embodiments include a display apparatus having a relatively low occurrence rate of defects due to external impact. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a mask layer having a plurality of openings, a substrate disposed below the mask layer and having a plurality of first grooves corresponding to the plurality of openings, an inorganic insulating layer disposed on the mask layer and having through holes corresponding to at least some of the plurality of openings, and an organic insulating layer disposed on the inorganic insulating layer and filling the through holes.

When viewed in a direction perpendicular to the substrate, the plurality of openings may overlap the plurality of first grooves.

The plurality of openings may be in one-to-one correspondence with the plurality of first grooves.

When viewed in a direction perpendicular to the substrate, each of the through holes may have a shape extending in a major axis direction, and a width of each of the through holes in a minor axis direction crossing the major axis direction may be less than a width of a corresponding one of the plurality of first grooves in the minor axis direction.

The display apparatus may further include a barrier layer disposed between the substrate and the inorganic insulating layer and having a constant thickness throughout an entire area.

The display apparatus may further include a barrier layer disposed between the substrate and the inorganic insulating layer, and a buffer layer disposed between the barrier layer and the inorganic insulating layer and having second grooves corresponding to the through holes.

The barrier layer may have a constant thickness throughout an entire area.

A distance from a bottom surface of each of the second grooves to a bottom surface of the substrate may be less than a thickness of the substrate.

In the first grooves, a distance from an upper surface of the buffer layer to a bottom surface of the substrate may be less than a thickness of the substrate.

When viewed in a direction perpendicular to the substrate, the second grooves may overlap the through holes.

The second grooves may be in one-to-one correspondence with the through holes.

An inner side surface of each of the second grooves and an inner side surface of a corresponding one of the through holes may form a continuous surface.

The organic insulating layer may fill the second grooves.

The organic insulating layer may contact a bottom surface of each of the second grooves.

The mask layer may include a metal.

The display apparatus may further include a bonding layer disposed between the substrate and the mask layer.

The bonding layer may include an inorganic insulating material.

The bonding layer may include a plurality of additional openings corresponding to the plurality of openings.

When viewed in a direction perpendicular to the substrate, the plurality of openings may overlap the plurality of additional openings.

The plurality of openings may be in one-to-one correspondence with the plurality of additional openings.

An inner side surface of each of the plurality of first grooves, an inner side surface of a corresponding one of the plurality of additional openings, and an inner side surface of a corresponding one of the plurality of openings may form a continuous surface.

The mask layer may include an inorganic insulating material.

The display apparatus may further include a bottom metal layer disposed between the mask layer and the inorganic insulating layer and having a plurality of apertures corresponding to the plurality of openings.

The display apparatus may further include a semiconductor layer disposed between the mask layer and the inorganic insulating layer and positioned within the mask layer when viewed in a direction perpendicular to the substrate.

These and/or other aspects will become apparent and more readily appreciated from the following description of the embodiments, the accompanying drawings, and claims.

BRIEF DESCRIPTION OF THE DRAWINGS

The above and other aspects of certain embodiments of the disclosure will be more apparent from the following description taken in conjunction with the accompanying drawings, in which:

Figure 12:
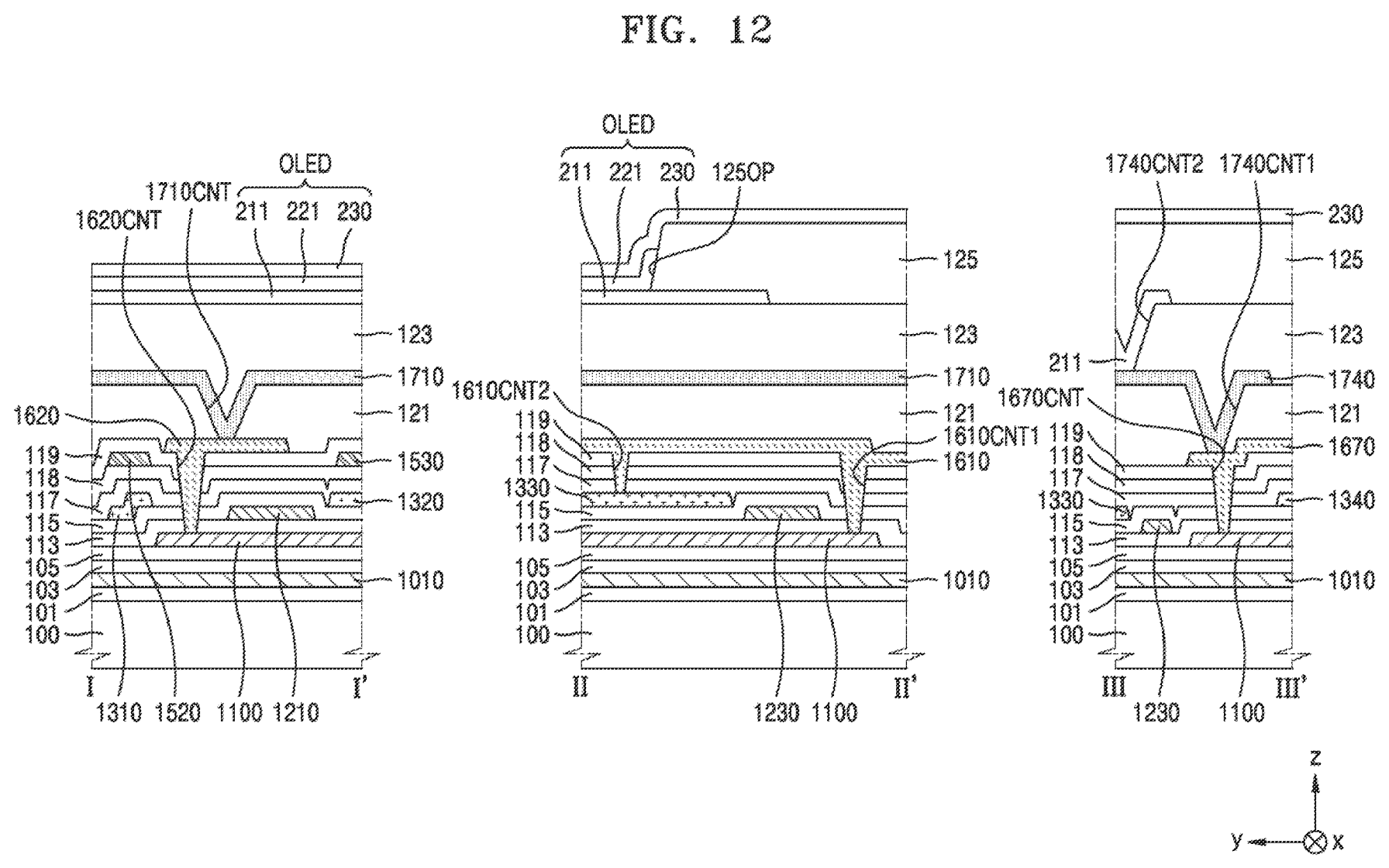

FIG. 12 is a cross-sectional view schematically illustrating cross-sections of the display apparatus of FIG. 3, taken along the lines I-I', II-II', and III-III';

DETAILED DESCRIPTION

Figure 1:
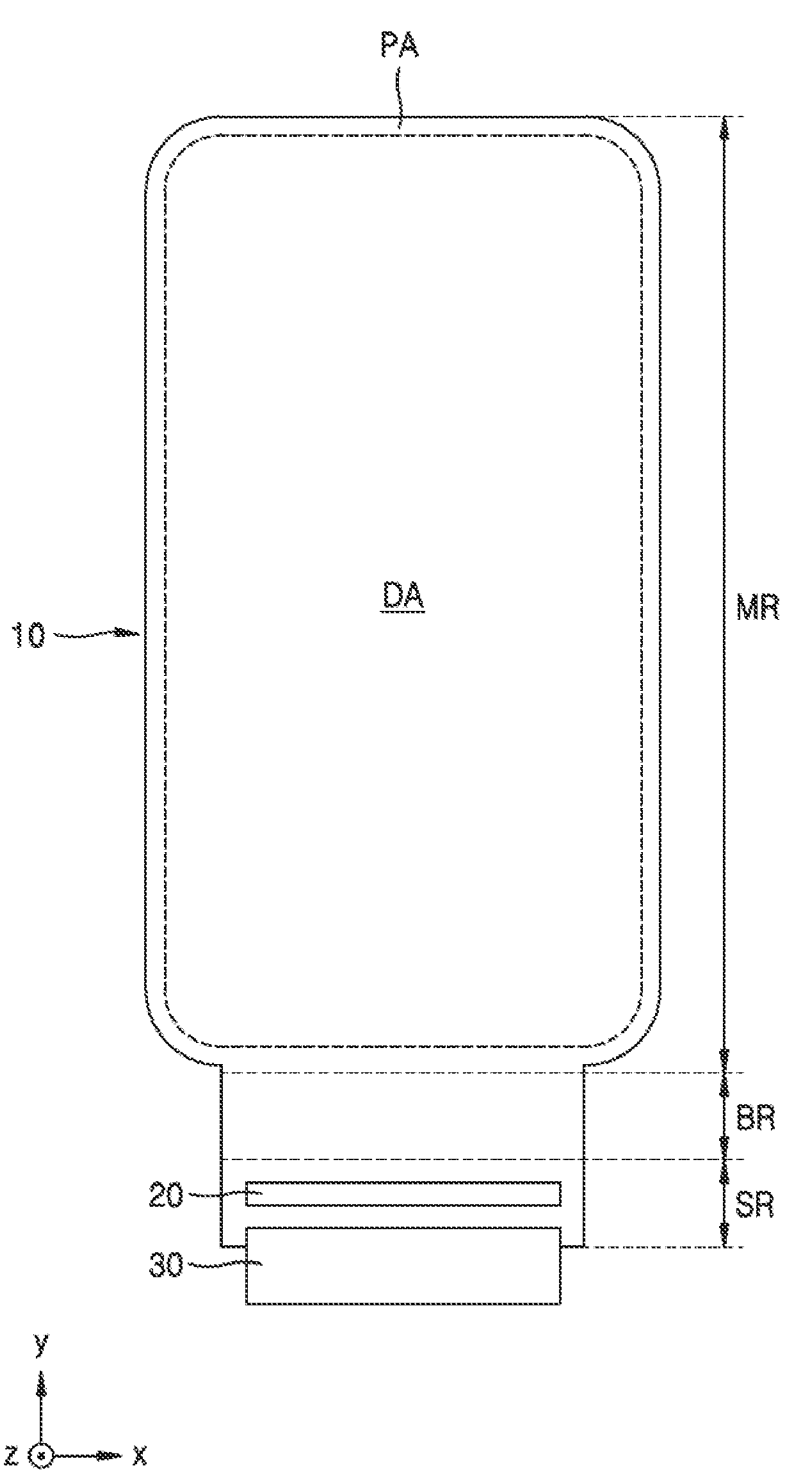
FIG. 1 is a plan view schematically illustrating a portion of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view schematically illustrating a portion of a display apparatus according to one or more embodiments.

As shown in FIG. 1, the display apparatus may include a display panel 10. The display apparatus may be any display apparatus that includes the display panel 10. For example, the display apparatus may include various products, such as smartphones, tablet computers, laptop computers, televisions, or advertisement boards.

The display panel 10 may include a display area DA and a peripheral area PA outside the display area DA. The display area DA may include a portion in which an image is displayed, and a plurality of pixels may be arranged in the display area DA. When viewed in a direction approximately perpendicular to the display panel 10, the display panel 10 may have various shapes, such as a circle, an ellipse, a polygon, or a particular figure. In FIG. 1, the display area DA has a substantially rectangular shape with rounded corners.

The peripheral area PA may be arranged outside the display area DA. The width (in the x-axis direction) of a portion of the peripheral area PA may be less than the width (in the x-axis direction) of the display area DA. Through this structure, if suitable, at least a portion of the peripheral area PA may be easily bendable, as described below.

Because the display panel 10 includes a substrate 100 (see FIG. 12), it may be stated that the substrate 100 includes the display area DA and the peripheral area PA. Hereinafter, for convenience of description, the substrate 100 will be described as including the display area DA and the peripheral area PA.

If suitable, the display panel 10 may be said to include a main area MR, a bending area BR outside the main area MR, and a sub area SR positioned on the opposite side of the main area MR around the bending area BR. In the bending area BR, the display panel 10 may be bent so that at least a part of the sub area SR overlaps the main area MR when viewed in the z-axis direction. However, the disclosure is not limited to a bendable display apparatus and may be applicable to a display apparatus that is not bendable. The sub area SR may include a non-display area. By bending the display panel 10 in the bending area BR, when the display apparatus is viewed from the front (in the −z direction), the non-display area might not be visible, and even in a case in which the non-display area is visible, the visible portion of the non-display area may be reduced.

A driving chip 20 or the like may be arranged in the sub area SR of the display panel 10. The driving chip 20 may include an integrated circuit configured to drive the display panel 10. The integrated circuit may include a data driving integrated circuit configured to generate a data signal, but the disclosure is not limited thereto.

The driving chip 20 may be mounted in the sub area SR of the display panel 10. The driving chip 20 is mounted on the same surface as a display surface of the display area DA, but when the display panel 10 is bent in the bending area BR, as described above, the driving chip 20 may be located on the rear surface of the main area MR.

A printed circuit board 30 or the like may be attached to an end of the sub area SR of the display panel 10. The printed circuit board 30 or the like may be electrically connected to the driving chip 20 or the like through a pad on the substrate 100.

Although an organic light-emitting display apparatus is hereinafter described as an example of the display apparatus according to one or more embodiments, the display apparatus of the disclosure is not limited thereto. In one or more other embodiments, the display apparatus of the disclosure may include a display apparatus, such as an inorganic light-emitting display apparatus (an inorganic light-emitting display or an inorganic electroluminescent (EL) display) or a quantum dot light-emitting display. For example, an emission layer of the display element included in the display apparatus may include an organic material or an inorganic material. In addition, the display apparatus may have an emission layer and a quantum dot layer in a path of light emitted from the emission layer.

As described above, the display panel 10 may include the substrate 100. Various elements included in the display panel 10 may be located over the substrate 100. The substrate 100 may include glass, metal, or polymer resin. When the display panel 10 is bent in the bending area BR, as described above, it may be suitable that the substrate 100 is flexible or bendable. In this case, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may have a multi-layer structure including two layers and a barrier layer therebetween, each of the two layers may include polymer resin, and the barrier layer may include an inorganic material, such as silicon oxide, silicon nitride, and silicon oxynitride, and various modifications may be made.

A plurality of pixels may be in the display area DA. Each of the pixels refers to a sub-pixel, and may include a display element, such as an organic light-emitting diode. The pixel may emit, for example, red, green, blue, or white light.

The pixel may be electrically connected to external circuits arranged in the peripheral area PA. In the peripheral area PA, a scan-driving circuit, an emission-control-driving circuit, a terminal, a driving power supply line, an electrode power supply line, and the like may be arranged. The scan-driving circuit may provide a scan signal to the pixel through a scan line SL (see FIG. 2). The emission-control-driving circuit may provide an emission control signal to the pixel through an emission control line. A terminal arranged in the peripheral area PA of the substrate 100 may be exposed without being covered by an insulating layer, and may be electrically connected to the printed circuit board 30. A terminal of the printed circuit board 30 may be electrically connected to a terminal of the display panel 10.

The printed circuit board 30 transmits a signal or power from a controller to the display panel 10. Control signals generated by the controller may be transmitted to driving circuits through the printed circuit board 30. In addition, the controller may transmit a first power voltage ELVDD (see FIG. 2) to the driving power supply line, and may provide a second power voltage ELVSS (see FIG. 2) to the electrode power supply line. The first power voltage ELVDD, which is a driving voltage, may be transmitted to each pixel through a driving power supply line 1730 (see FIG. 11) connected to the driving power supply line, and the second power voltage ELVSS, which is a common voltage, may be transmitted to an opposite electrode 230 (see FIG. 12) of the pixel connected to the electrode power supply line. The electrode power supply line may have a loop shape with one side open, and may have a shape that partially surrounds the display area DA.

Figure 11:
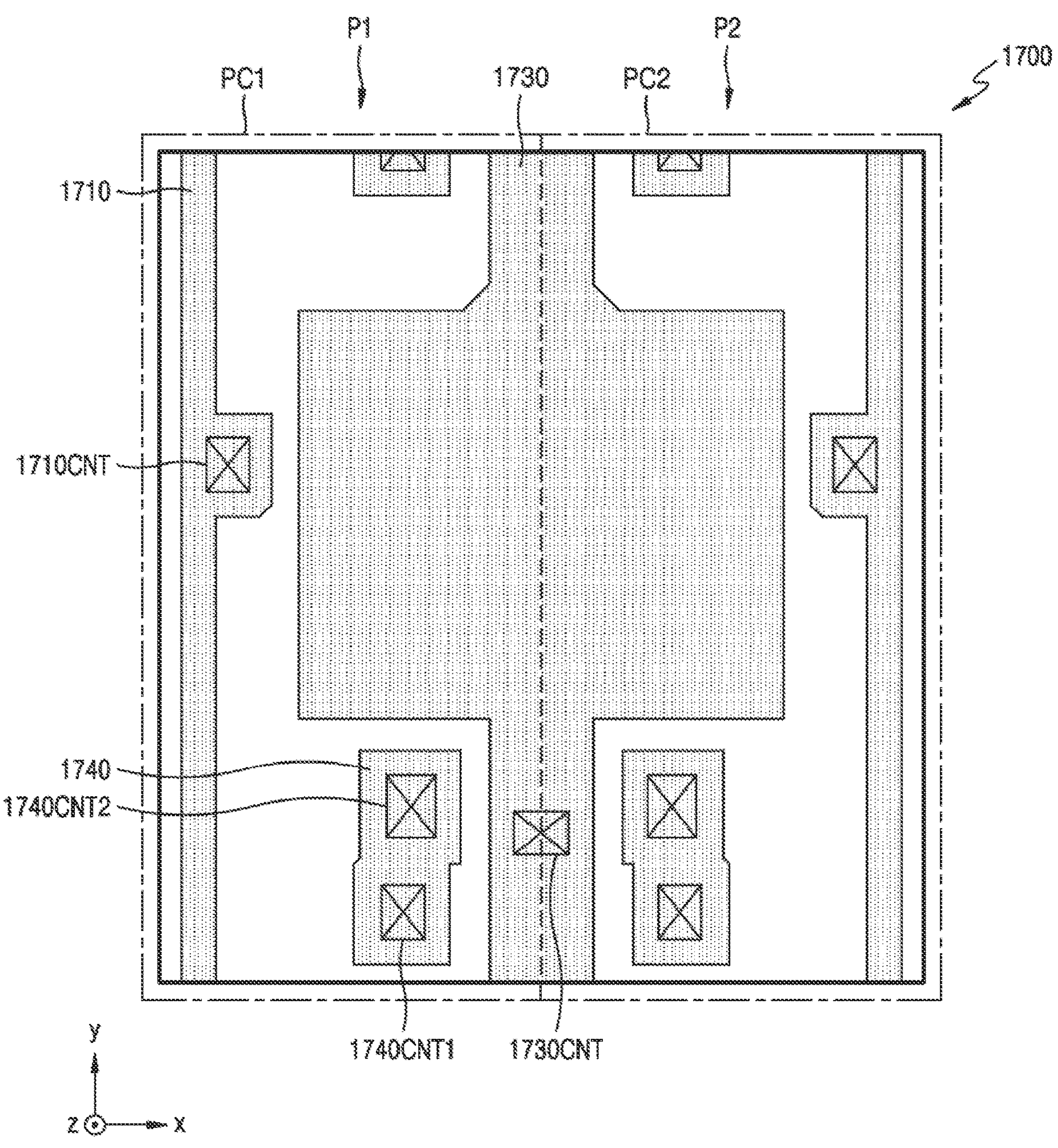

The controller may generate a data signal, and the generated data signal may be transmitted to the pixel through a driving chip 20 and a data line 1710 (see FIG. 11).

For reference, "line" may refer to "wiring line". The same applies to embodiments to be described below and modifications thereof.

Figure 2:
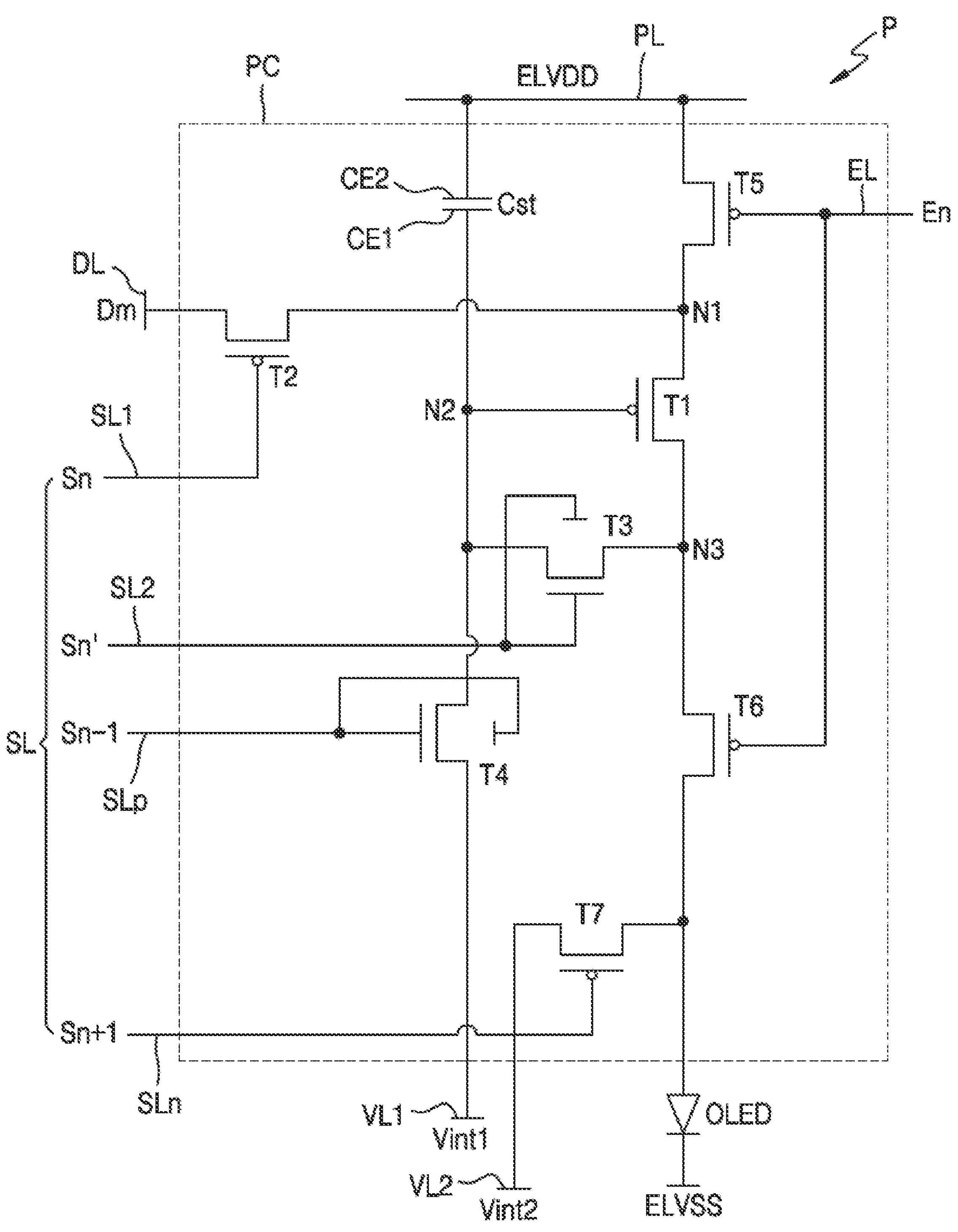
FIG. 2 is an equivalent circuit diagram of a pixel included in the display apparatus of FIG. 1.

FIG. 2 is an equivalent circuit diagram of a pixel P included in the display apparatus of FIG. 1. As shown in FIG. 2, the pixel P may include a pixel circuit PC and an organic light-emitting diode OLED electrically connected to the pixel circuit PC.

The pixel circuit PC may include a plurality of thin-film transistors T1 to T7 and a storage capacitor Cst, as shown in FIG. 2. The plurality of thin-film transistors T1 to T7 and the storage capacitor Cst may be connected to signal lines SL1, SL2, SLp, SLn, EL, and DL, a first initialization voltage line VL1, a second initialization voltage line VL2, and a driving voltage supply line PL. At least any one of these lines, for example, the driving voltage supply line PL, may be shared by neighboring pixels P.

The plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode and an opposite electrode, wherein the pixel electrode may be connected to the driving transistor T1 via the emission control transistor T6, and may receive a driving current, and the opposite electrode may receive a second power voltage ELVSS. The organic light-emitting diode OLED may generate light of a luminance corresponding to the driving current.

Some of the plurality of thin-film transistors T1 to T7 may be n-channel metal-oxide-semiconductor field-effect-transistors (n-channel MOSFETs, or NMOS), and the other ones may be p-channel MOSFETs (PMOS). For example, the compensation transistor T3 and the first initialization transistor T4 from among the plurality of thin-film transistors T1 to T7 may be NMOS, and the other ones may be PMOS. In some embodiments, the compensation transistor T3, the first initialization transistor T4, and the second initialization transistor T7 from among the plurality of thin-film transistors T1 to T7 may be NMOS, and the other ones may be PMOS. In some embodiments, the plurality of thin-film transistors T1 to T7 may all be NMOS or may all be PMOS. Each of the plurality of thin-film transistors T1 to T7 may include amorphous silicon or polysilicon. If suitable, a thin-film transistor as an NMOS may include an oxide semiconductor. Hereinafter, it is described that the compensation transistor T3 and the first initialization transistor T4 are NMOS including an oxide semiconductor, and the other thin-film transistors are PMOS, for convenience of description.

The signal lines may include a first scan line SL1 configured to transmit a first scan signal Sn to the switching transistor T2, a second scan line SL2 configured to transmit a second scan signal Sn' to the compensation transistor T3, a previous scan line SLp configured to transmit a previous scan signal Sn−1 to the first initialization transistor T4, a next scan line SLn configured to transmit a next scan signal Sn+1 to the second initialization transistor T7, an emission control line EL configured to transmit an emission control signal En to the operation control transistor T5 and the emission control transistor T6, and a data line DL which crosses the first scan line SL1 and is configured to transmit a data signal Dm to the switching transistor T2.

The driving voltage supply line PL may be configured to transmit the driving voltage ELVDD to the driving transistor T1, the first initialization voltage line VL1 may be configured to transmit a first initialization voltage Vint1 to the first initialization transistor T4 for initializing the driving transistor T1, and the second initialization voltage line VL2 may be configured to transmit a second initialization voltage Vint2 to the second initialization transistor T7 for initializing the pixel electrode of the organic light-emitting diode OLED.

A driving gate electrode of the driving transistor T1 may be connected to the storage capacitor Cst through a second node N2, wherein any one of a source region and a drain region of the driving transistor T1 may be connected to the driving voltage supply line PL via the operation control transistor T5 through a first node N1, and the other one of the source region and the drain region of the driving transistor T1 may be electrically connected to the pixel electrode of the organic light-emitting diode OLED via the emission control transistor T6 through a third node N3. The driving transistor T1 may receive the data signal Dm according to a switching operation of the switching transistor T2, and may supply a driving current to the organic light-emitting diode OLED. In other words, the driving transistor T1 may control an amount of current that flows to the organic light-emitting diode OLED from the first node N1, which is electrically connected to the driving voltage supply line PL, in response to a voltage applied to the second node N2 that varies according to the data signal Dm.

A switching gate electrode of the switching transistor T2 may be connected to the first scan line SL1 configured to transmit the first scan signal Sn to the switching transistor T2, wherein any one of a source region and a drain region of the switching transistor T2 may be connected to the data line DL, and the other one of the source region and the drain region of the switching transistor T2 may be connected to the driving voltage supply line PL via the operation control transistor T5, and also to the driving transistor T1 through the first node N1. In response to a voltage applied to the first scan line SL1, the switching transistor T2 may be configured to transmit the data signal Dm from the data line DL to the first node N1. In other words, the switching transistor T2 may be turned on in response to the first scan signal Sn received through the first scan line SL1, and may perform a switching operation for transmitting the data signal Dm received via the data line DL to the driving transistor T1 through the first node N1.

A compensation gate electrode of the compensation transistor T3 may be connected to the second scan line SL2. Any one of a source region and a drain region of the compensation transistor T3 may be connected to the pixel electrode of the organic light-emitting diode OLED via the emission control transistor T6 through the third node N3. The other one of the source region and the drain region of the compensation transistor T3 may be connected to a first capacitor electrode CE1 of the storage capacitor Cst and to the driving gate electrode of the driving transistor T1 through the second node N2. The compensation transistor T3 as described above may be turned on in response to the second scan signal Sn' received through the second scan line SL2, and may diode-connect the driving transistor T1.

A first initialization gate electrode of the first initialization transistor T4 may be connected to the previous scan line SLp. Any one of a source region and a drain region of the first initialization transistor T4 may be connected to the first initialization voltage line VL1. The other one of the source region and the drain region of the first initialization transistor T4 may be connected to the first capacitor electrode CE1 of the storage capacitor Cst and to the driving gate electrode of the driving transistor T1 through the second node N2. The first initialization transistor T4 may be configured to apply the first initialization voltage Vint1 to the second node N2 from the first initialization voltage line VL1 in response to a voltage applied to the previous scan line SLp. In other words, the first initialization transistor T4 may be turned on in response to the previous scan signal Sn−1 received through the previous scan line SLp, and may perform an initialization operation for applying the first initialization voltage Vint1 to the driving gate electrode of the driving transistor T1 and for initializing a voltage of the driving gate electrode of the driving transistor T1.

An operation control gate electrode of the operation control transistor T5 may be connected to the emission control line EL, wherein any one of a source region and a drain region of the operation control transistor T5 may be connected to the driving voltage supply line PL, and the other one may be connected to the driving transistor T1 and the switching transistor T2 through the first node N1.

An emission control gate electrode of the emission control transistor T6 may be connected to the emission control line EL, wherein any one of a source region and a drain region of the emission control transistor T6 may be connected to the driving transistor T1 and to the compensation transistor T3 through the third node N3, and the other one of the source region and the drain region of the emission control transistor T6 may be electrically connected to the pixel electrode of the organic light-emitting diode OLED.

The operation control transistor T5 and the emission control transistor T6 may be concurrently or substantially simultaneously turned on in response to the emission control signal En received through the emission control line EL, so that the driving voltage ELVDD is applied to the organic light-emitting diode OLED, and so that a driving current flows in the organic light-emitting diode OLED.

A second initialization gate electrode of the second initialization transistor T7 may be connected to the next scan line SLn, wherein any one of a source region and a drain region of the second initialization transistor T7 may be connected to the pixel electrode of the organic light-emitting diode OLED, and the other one of the source region and the drain region of the second initialization transistor T7 may be connected to the second initialization voltage line VL2 and may receive the second initialization voltage Vint2. The second initialization transistor T7 may be turned on in response to the next scan signal Sn+1 received through the next scan line SLn, so that the pixel electrode of the organic light-emitting diode OLED is initialized. The next scan line SLn and the first scan line SL1 may be the same line. In this case, the corresponding scan line may be configured to transmit the same electrical signal with a time difference, and may function as the first scan line SL1 and also as the next scan line SLn. In other words, the next scan line SLn may include a first scan line of a pixel, which is adjacent to the pixel P shown in FIG. 2, and which is electrically connected to the data line DL.

The second initialization transistor T7 may be connected to the next scan line SLn, as shown in FIG. 2. However, the disclosure is not limited thereto, and the second initialization transistor T7 may be connected to the emission control line EL, and may be driven according to the emission control signal En.

The storage capacitor Cst may include the first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the driving voltage supply line PL. The storage capacitor Cst may store a charge corresponding to a voltage difference between the voltage of the driving gate electrode of the driving transistor T1 and the driving voltage ELVDD.

A detailed operation of each pixel P according to one or more embodiments is described below.

During an initialization period, when the previous scan signal Sn−1 is supplied through the previous scan line SLp, the first initialization transistor T4 may be turned on in response to the previous scan signal Sn−1, and the driving transistor T1 may be initialized according to the first initialization voltage Vint1 supplied through the first initialization voltage line VL1.

During a data programming period, when the first scan signal Sn and the second scan signal Sn' are respectively supplied through the first scan line SL1 and the second scan line SL2, the switching transistor T2 and the compensation transistor T3 may be turned on in response to the first scan signal Sn and the second scan line Sn' respectively. In this case, the driving transistor T1 may be diode-connected by the compensation transistor T3 that is turned on, and may be biased in a forward direction. Then, a compensation voltage (Dm+Vth, where Vth has a negative value), which is obtained by subtracting the data signal Dm received through the data line DL by a threshold voltage Vth of the driving transistor T1, may be applied to the driving gate electrode of the driving transistor T1. The driving voltage ELVDD and the compensation voltage (Dm+Vth) are respectively applied to opposite ends of the storage capacitor Cst, and a charge corresponding to a voltage difference between the opposite ends of the storage capacitor Cst may be stored in the storage capacitor Cst.

During an emission period, the operation control transistor T5 and the emission control transistor T6 may be turned on in response to the emission control signal En received through the emission control line EL. A driving current corresponding to a voltage difference between the voltage of the driving gate electrode of the driving transistor T1 and the driving voltage ELVDD may be generated, and the driving current may be supplied to the organic light-emitting diode OLED through the emission control transistor T6.

As described above, some of the plurality of thin-film transistors T1 to T7 may include an oxide semiconductor. For example, the compensation transistor T3 and the first initialization transistor T4 may include an oxide semiconductor.

In a case of polysilicon, which is relatively highly reliable, it may be precisely controlled so that an intended current flows. Accordingly, when a semiconductor layer including highly reliable polysilicon is included in the driving transistor T1 that directly affects a brightness of the display apparatus, a high-resolution display apparatus may be implemented. In addition, an oxide semiconductor has high carrier mobility and low leakage current, and thus, a voltage drop is not unsuitably large even when a driving time is relatively long. In other words, in an oxide semiconductor, a change in color of an image according to a voltage drop is not unsuitably large even when the display apparatus is driven at relatively low frequencies, and thus, the display apparatus may be driven at low frequencies. Accordingly, when the compensation transistor T3 and the first initialization transistor T4 include an oxide semiconductor, a display apparatus with reduced power consumption, while reducing or preventing leakage current, may be implemented.

Meanwhile, such an oxide semiconductor may be sensitive to light, and thus, an amount of current or the like may vary depending on external light. Accordingly, a metal layer may be located under the oxide semiconductor, and may absorb or reflect the external light. Accordingly, as shown in FIG. 2, in each of the compensation transistor T3 and the first initialization transistor T4 including the oxide semiconductor, a gate electrode may be located over and below an oxide semiconductor layer. In other words, when viewed in the direction (the z-axis direction) that is perpendicular to the upper surface of the substrate 100, the metal layer located under the oxide semiconductor may overlap the oxide semiconductor.

Figure 3:
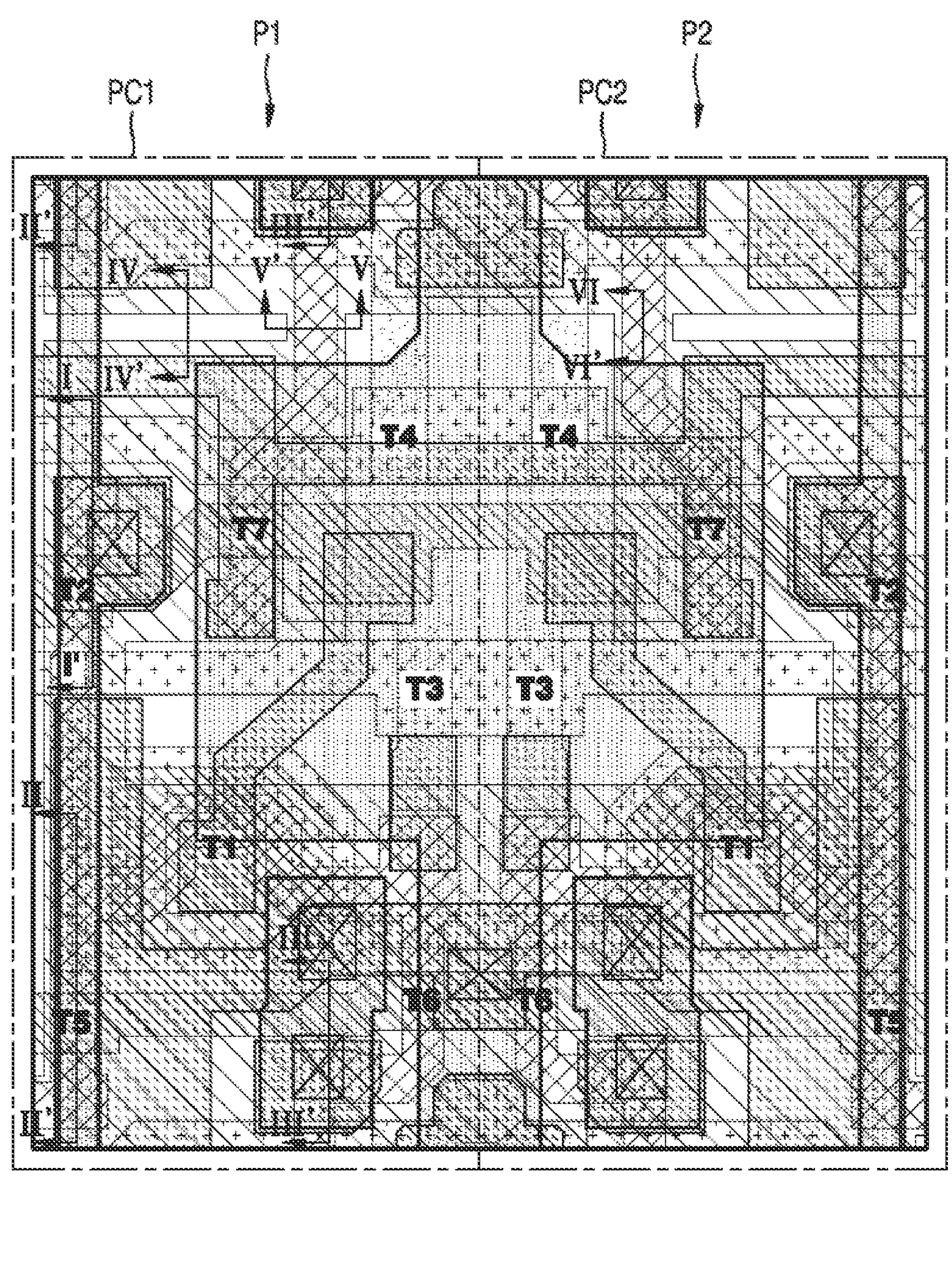
FIG. 3 is a layout diagram schematically illustrating positions of transistors, a capacitor, and the like in pixels included in the display apparatus of FIG. 1.
Figure 13:
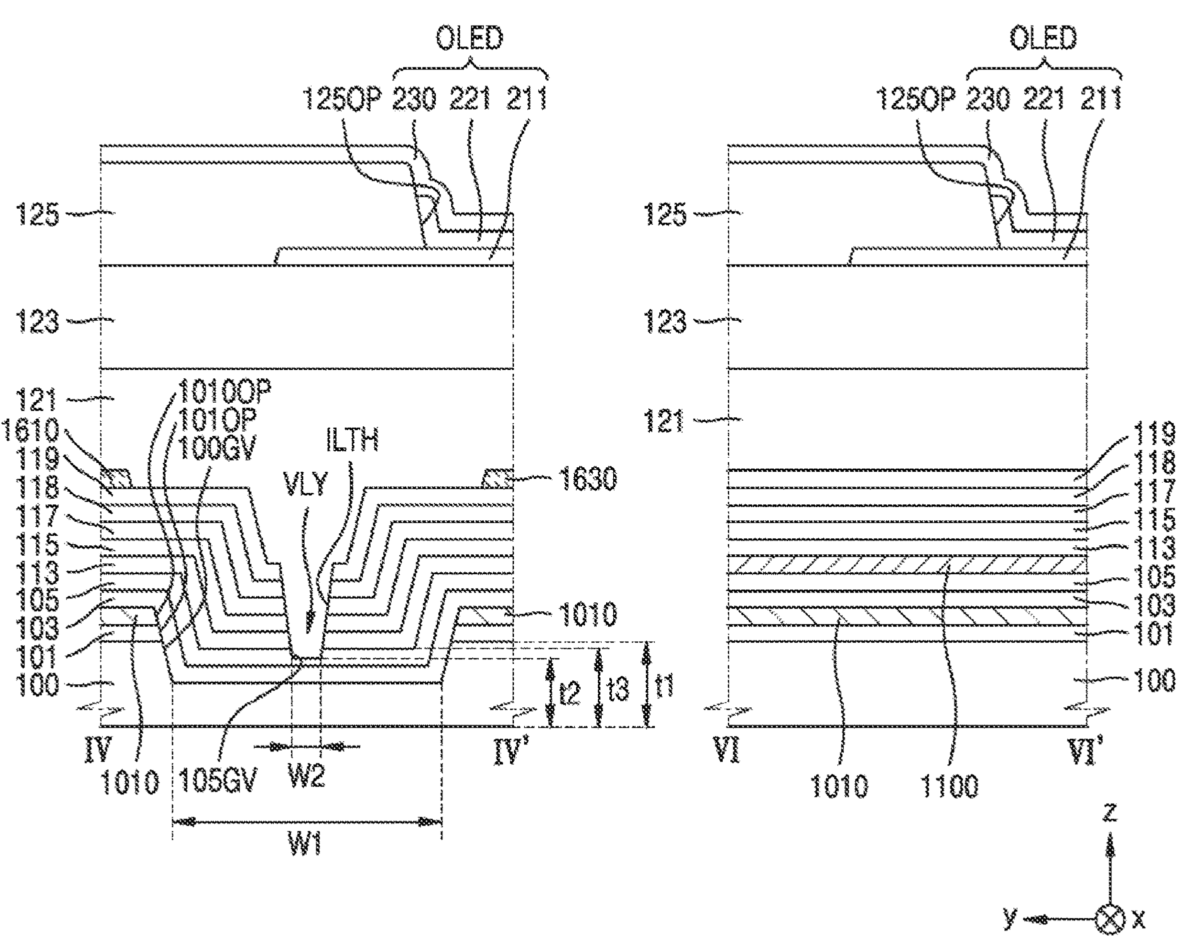
FIG. 13 is a cross-sectional view schematically illustrating cross-sections of the display apparatus of FIG. 3, taken along the lines IV-IV' and VI-VI'.
Figure 14:
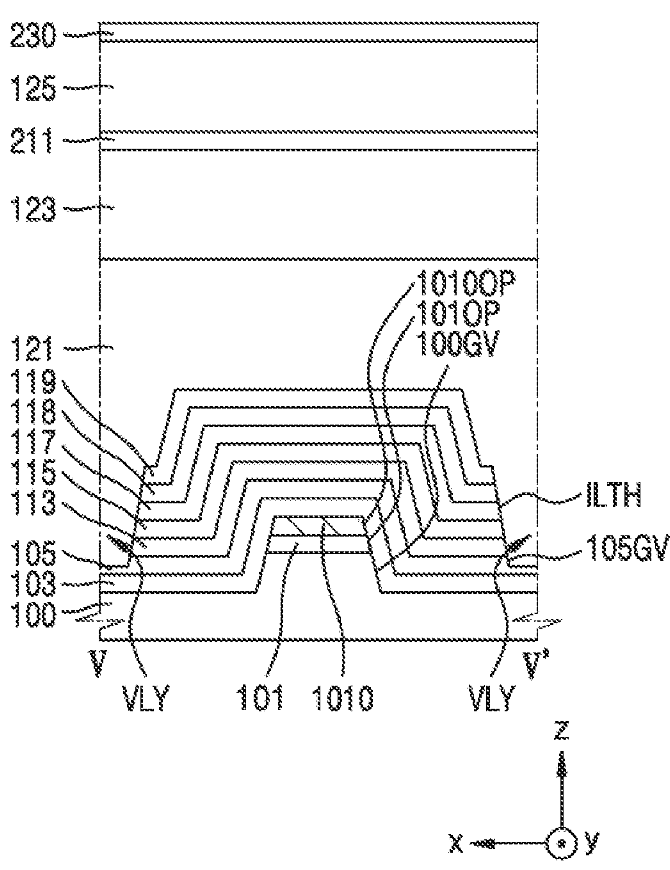
FIG. 14 is a cross-sectional view schematically illustrating a cross-section of the display apparatus of FIG. 3, taken along the line V-V'.

FIG. 3 is a layout diagram schematically illustrating positions of thin-film transistors T1 to T7, a storage capacitor Cst, and the like in pixels included in the display apparatus of FIG. 1. FIGS. 4 to 11 are layout diagrams schematically illustrating elements of the display apparatus shown in FIG. 3, such as the thin-film transistors T1 to T7 and the storage capacitor Cst, for each layer. FIG. 12 is a cross-sectional view schematically illustrating cross-sections of the display apparatus of FIG. 3, taken along the lines I-I', II-II', and III-III'. FIG. 13 is a cross-sectional view schematically illustrating cross-sections of the display apparatus of FIG. 3, taken along the lines IV-IV' and VI-VI'. FIG. 14 is a cross-sectional view schematically illustrating a cross-section of the display apparatus of FIG. 3, taken along the line V-V'.

As shown in these drawings, the display apparatus may include a first pixel P1 and a second pixel P2 that are adjacent to each other. The first pixel P1 and the second pixel P2 may be approximately symmetrical to each other with respect to a virtual line, as shown in FIG. 3, etc. However, the disclosure is not limited thereto, and the first pixel P1 and the second pixel P2 may not be symmetrical to each other, but may have the same configuration or may have different configurations.

The first pixel P1 may include a first pixel circuit PC1, and the second pixel P2 may include a second pixel circuit PC2. Hereinafter, for convenience of description, some conductive patterns are described based on the first pixel circuit PC1, but these conductive patterns may also be substantially symmetrically arranged in the second pixel circuit PC2.

Figure 4:
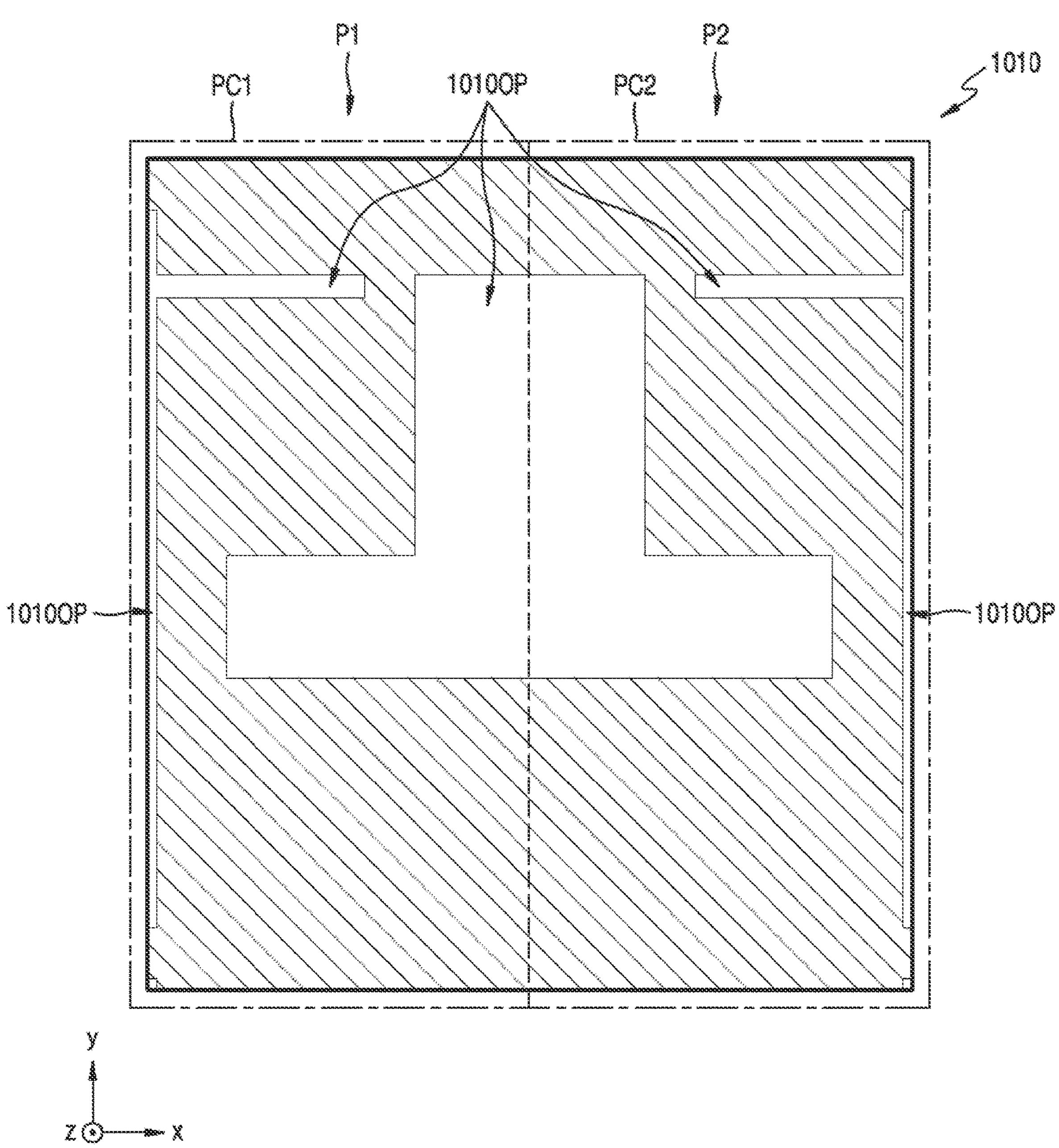
FIGS. 4 to 11 are layout diagrams schematically illustrating elements of the display apparatus shown in FIG. 3, such as transistors and a capacitor, for each layer.
Figure 5:
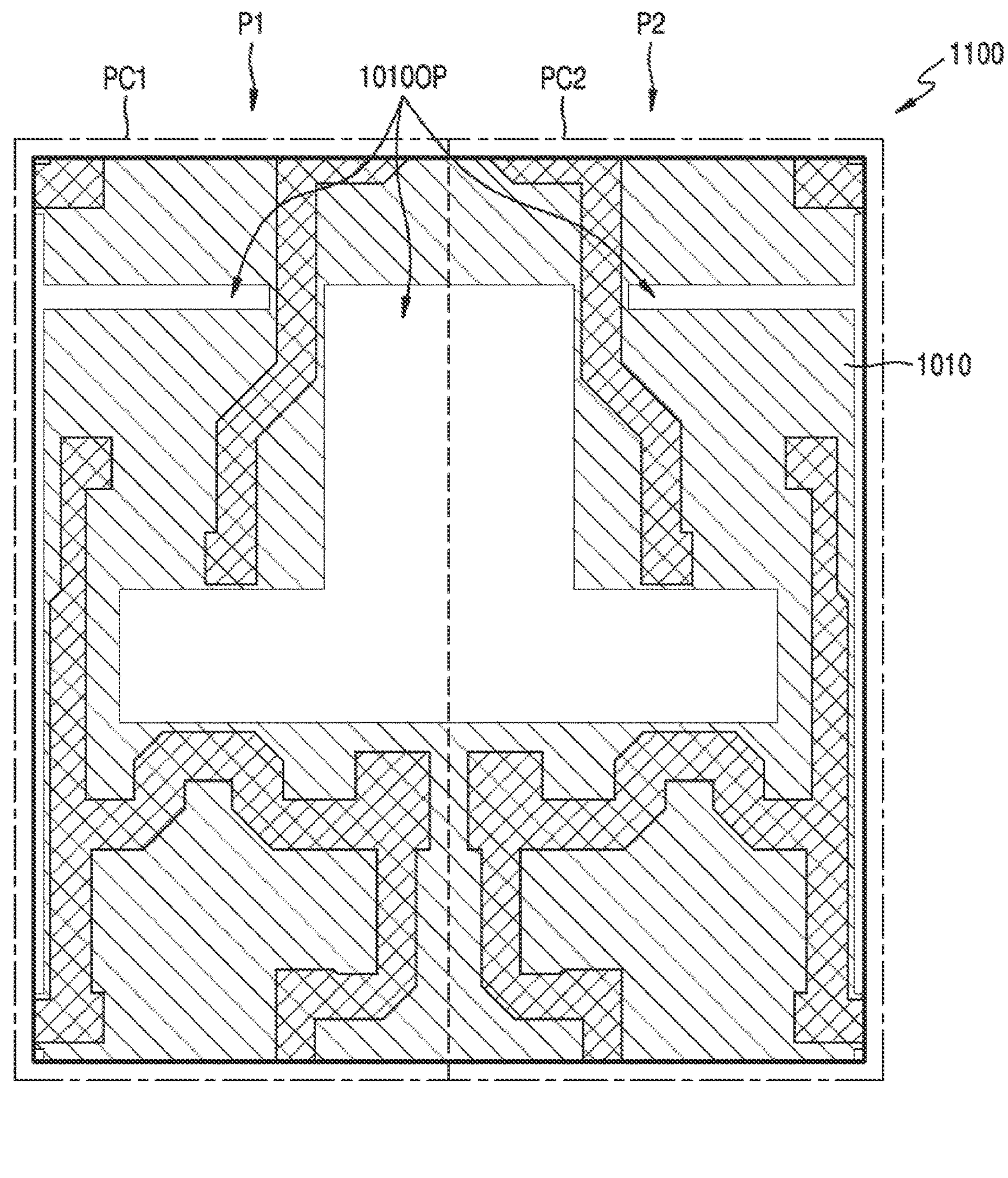
Figure 6:
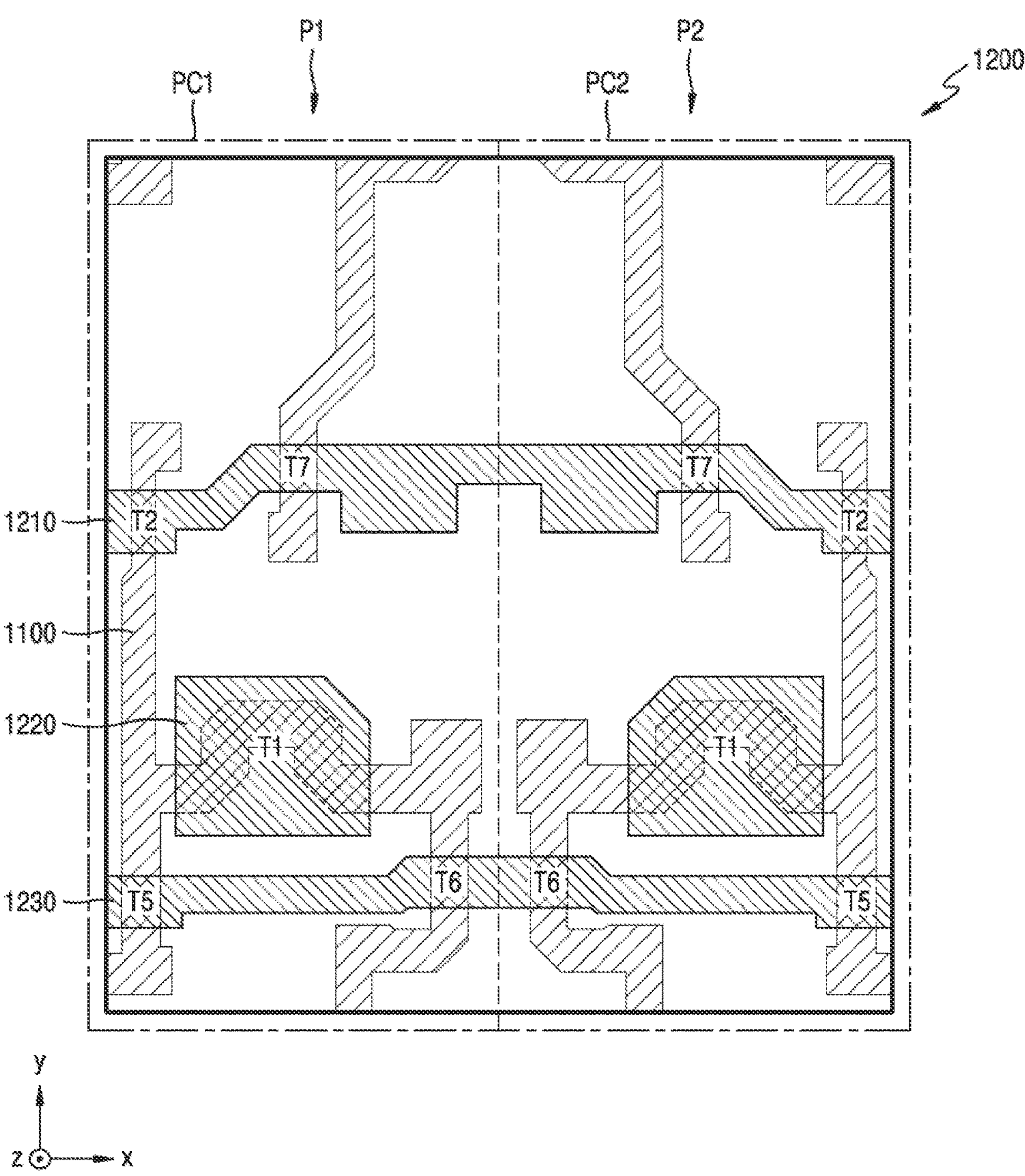
Figure 7:
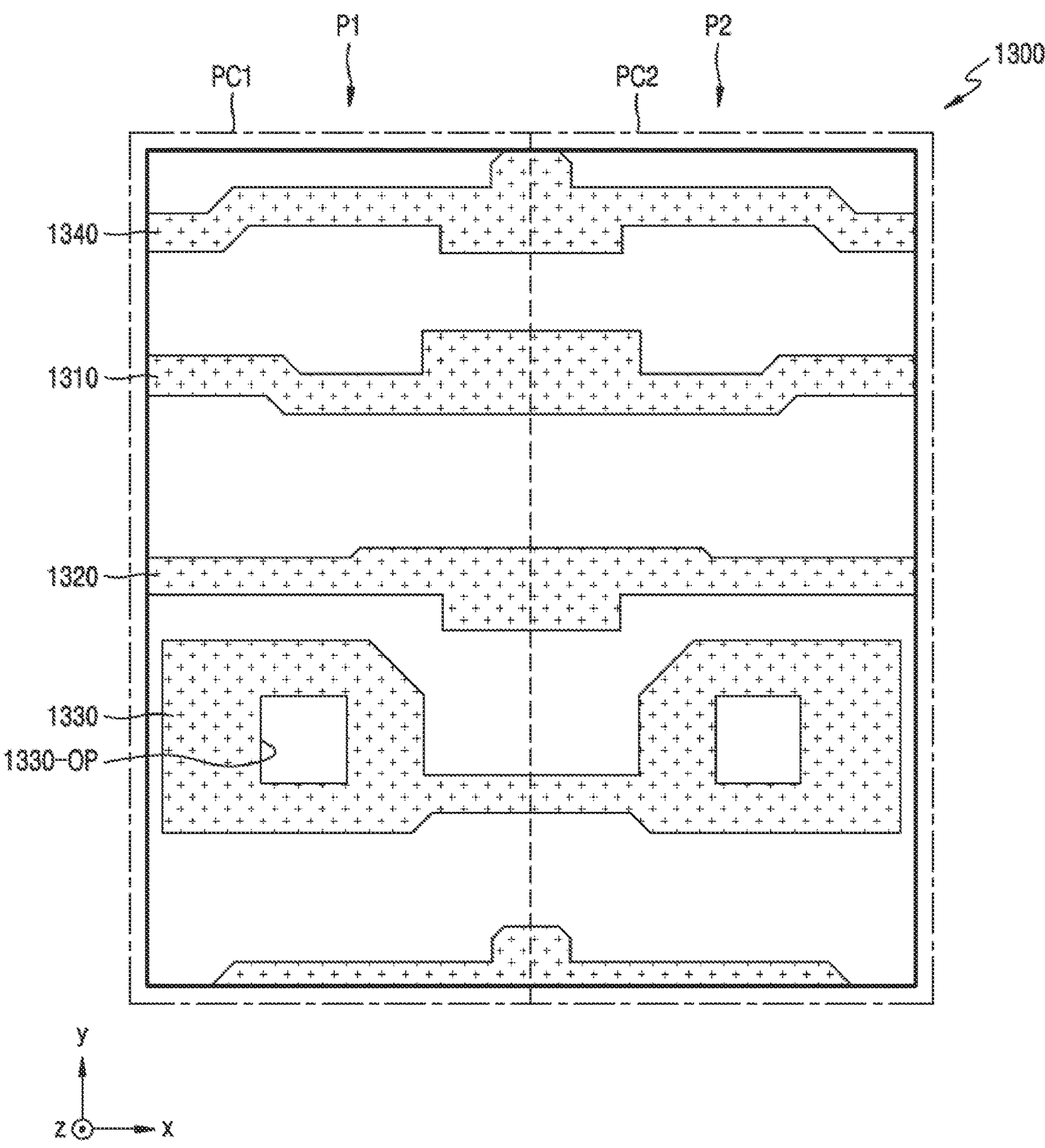
Figure 8:
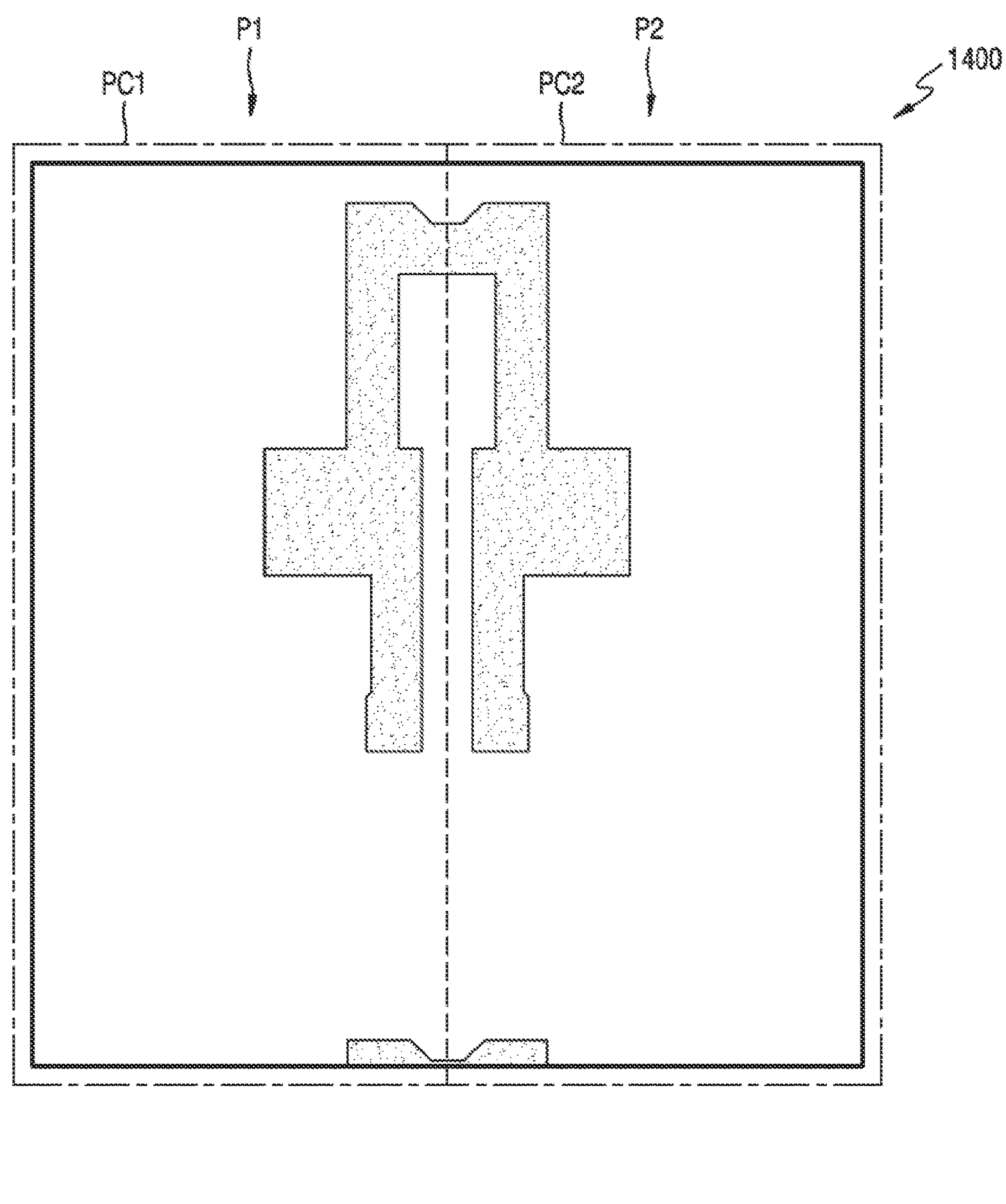
Figure 9:
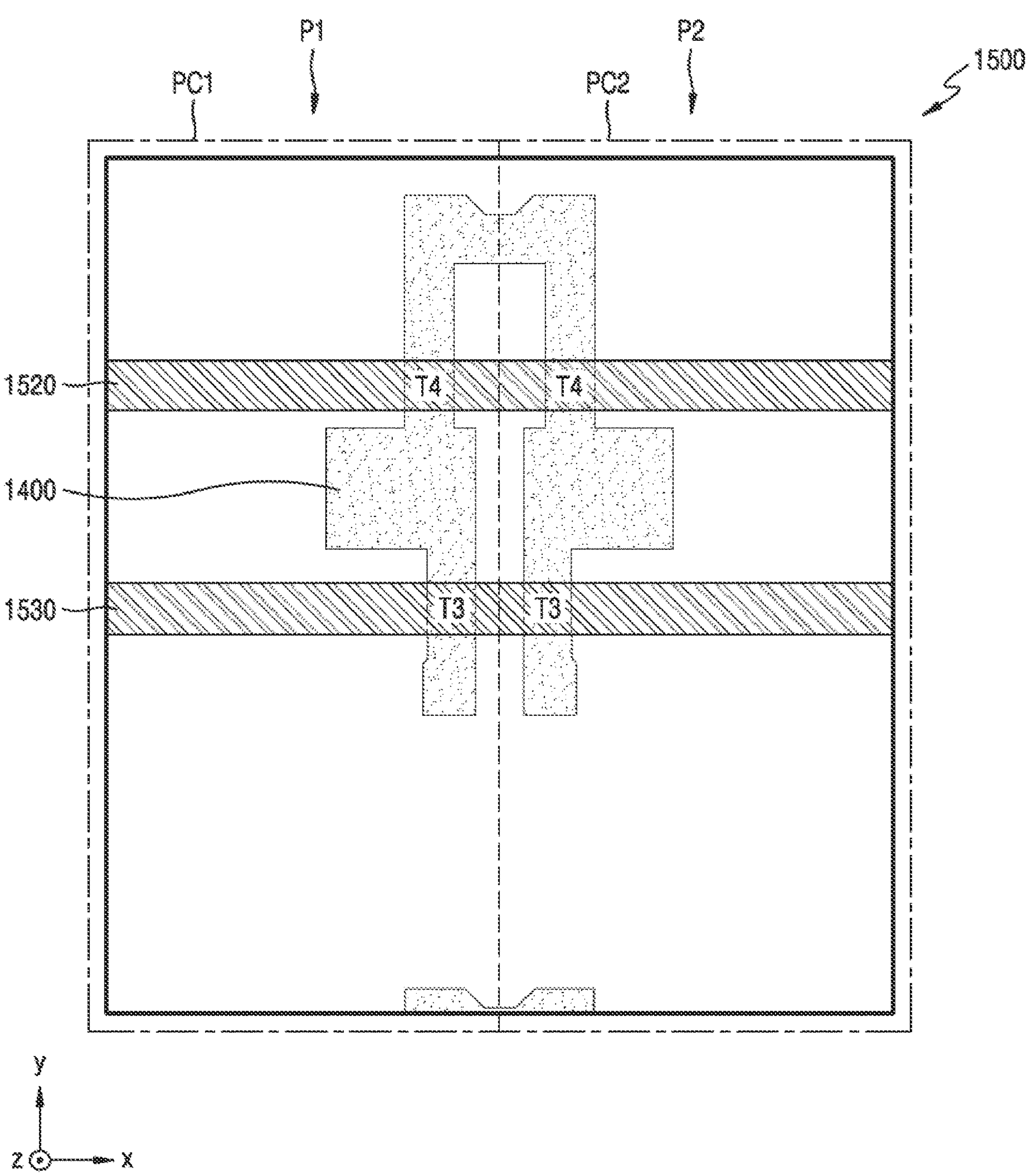
Figure 10:
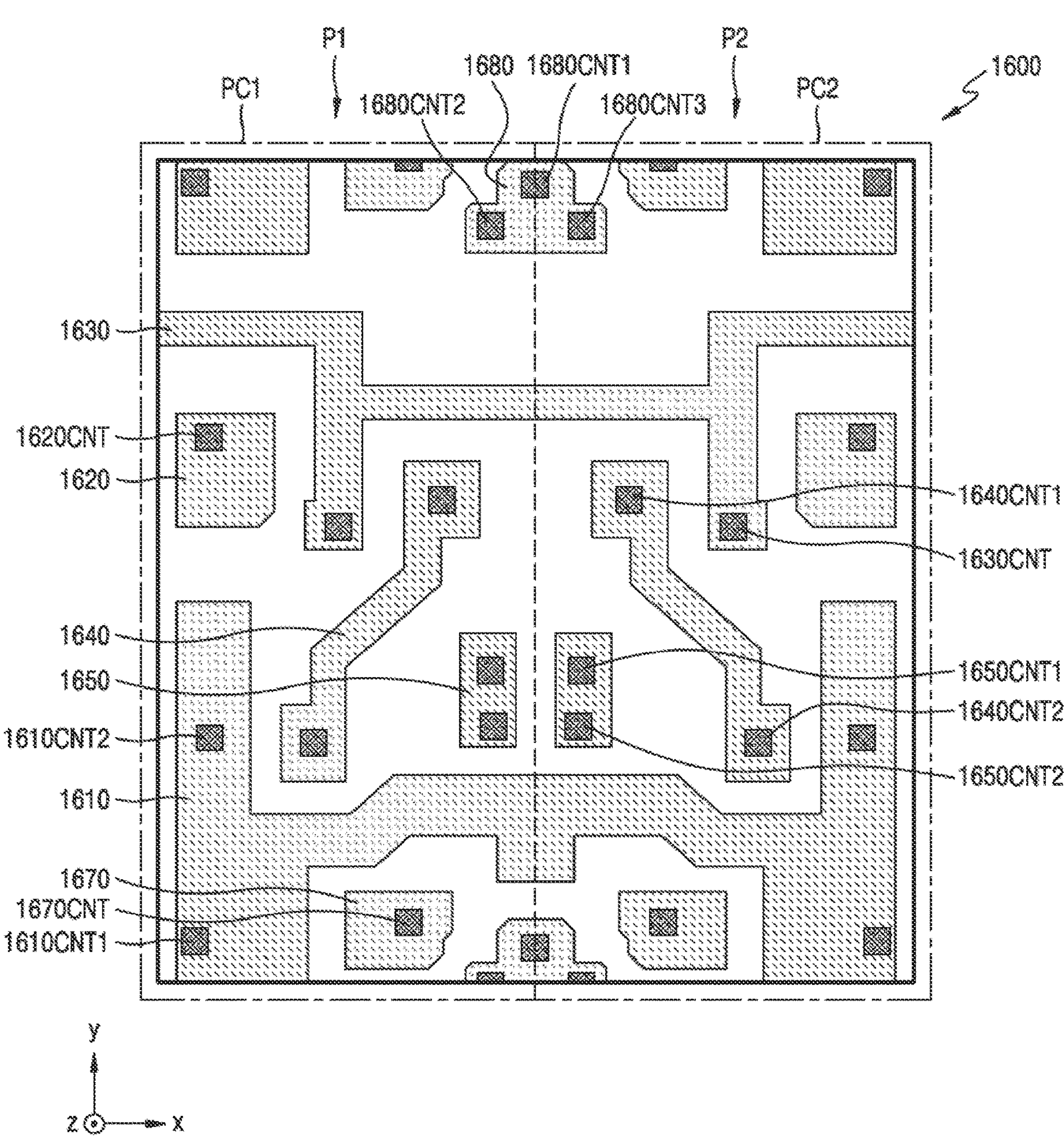

As sequentially shown in FIGS. 4 to 11, a mask layer 1010 in FIG. 4, a first semiconductor layer 1100 in FIG. 5, a first gate layer 1200 in FIG. 6, a second gate layer 1300 in FIG. 7, a second semiconductor layer 1400 in FIG. 8, a third gate layer 1500 in FIG. 9, a first source drain layer 1600 in FIG. 10, and a second source drain layer 1700 in FIG. 11 are sequentially located in a direction away from the substrate 100 from a place close to the substrate 100.

In addition, insulating layers may be located between these layers. For example, as shown in FIGS. 12 and 13, a bonding layer 101 may be located between the substrate 100 and the mask layer 1010 of FIG. 4. A barrier layer 103 and a buffer layer 105 may be located between the mask layer 1010 of FIG. 4 and the first semiconductor layer 1100 of FIG. 5. A first gate-insulating layer 113 may be located between the first semiconductor layer 1100 of FIG. 5 and the first gate layer 1200 of FIG. 6. A second gate-insulating layer 115 may be located between the first gate layer 1200 of FIG. 6 and the second gate layer 1300 of FIG. 7. A first interlayer insulating layer 117 may be located between the second gate layer 1300 of FIG. 7 and the second semiconductor layer 1400 of FIG. 8. A third gate-insulating layer 118 may be located between the second semiconductor layer 1400 of FIG. 8 and the third gate layer 1500 of FIG. 9. A second interlayer insulating layer 119 may be located between the third gate layer 1500 of FIG. 9 and the first source drain layer 1600 of FIG. 10. A first planarization layer 121 may be located between the first source drain layer 1600 of FIG. 10 and the second source drain layer 1700 of FIG. 11. In addition, a second planarization layer 123 may be located on the second source drain layer 1700.

Each of the insulating layers may have a single layer structure or a multi-layer structure as needed. Elements of different layers may be electrically connected to each other through contact holes formed in the insulating layers.

The mask layer 1010 shown in FIG. 4 may have (e.g., define) a plurality of openings 1010OP. The mask layer 1010 may include a metal, such as molybdenum, silver, copper, or aluminum. The mask layer 1010 may be used to form a first groove 100GV (see FIG. 13) in the substrate 100. In other words, by dry etching the substrate 100 using the mask layer 1010, the first grooves 100GV corresponding to the plurality of openings 1010OP of the mask layer 1010 may be formed on the upper surface of the substrate 100 in the +z direction. In addition, the mask layer 1010 may function to smooth crystallization of the first semiconductor layer 1100 shown in FIG. 5. From this point of view, the mask layer 1010 may be referred to as a bottom metal layer (BML) located below the first semiconductor layer 1100. This will be described later.

When the mask layer 1010 is directly formed on the substrate 100, peeling may occur between the mask layer 1010 and the substrate 100 during manufacturing or subsequent use because a bonding force between the mask layer 1010 including a metal and the substrate 100 may be relatively low. Accordingly, to reduce or prevent the likelihood of such a problem from occurring, a bonding layer 101 (see FIG. 13) may be located between the mask layer 1010 and the substrate 100. In other words, the bonding layer 101 including an inorganic insulating material, such as silicon oxide, silicon nitride, silicon oxynitride, aluminum oxide, titanium oxide, tantalum oxide, hafnium oxide, and/or zinc oxide, may be formed on the substrate 100, and then, a mask layer 1010 including a metal may be formed on the bonding layer 101.

A barrier layer 103 (see FIG. 12) including silicon oxide, silicon nitride, silicon oxynitride, aluminum oxide, titanium oxide, tantalum oxide, hafnium oxide, and/or zinc oxide may be located on the mask layer 1010. The barrier layer 103 may reduce or prevent diffusion of metal atoms or impurities from the substrate 100 toward the first semiconductor layer 1100 located thereon.

A buffer layer 105 (see FIG. 12) including silicon oxide, silicon nitride, silicon oxynitride, aluminum oxide, titanium oxide, tantalum oxide, hafnium oxide, and/or zinc oxide may be located on the barrier layer 103. During a crystallization process of forming the first semiconductor layer 1100, the buffer layer 105 may adjust a rate at which heat is provided, so that the first semiconductor layer 1100 is uniformly crystallized.

The first semiconductor layer 1100 shown in FIG. 5 may be located on the buffer layer 105. FIG. 5 illustrates that the first semiconductor layer 1100 overlaps the mask layer 1010 for convenience of description.

The first semiconductor layer 1100 may include a silicon semiconductor. For example, the first semiconductor layer 1100 may include amorphous silicon or polysilicon. For example, the first semiconductor layer 1100 may include polysilicon crystallized at a relatively low temperature. If suitable, ions may be injected into at least a portion of the first semiconductor layer 1100.

As can be seen in FIG. 5, when viewed in a direction perpendicular to the substrate 100 (e.g., in the z-axis direction), the first semiconductor layer 1100 may be located within the mask layer 1010. To form the first semiconductor layer 1100, an amorphous silicon layer may be formed on the substrate 100 and crystallized by irradiating an excimer laser beam or the like to the amorphous silicon layer to form a polysilicon layer. Then, the first semiconductor layer 1100 shown in FIG. 5 may be formed by patterning the polysilicon layer. The first semiconductor layer 1100 should have uniform electrical characteristics in several pixels so that, when the same electrical signal is applied to the pixels, light with relatively uniform luminance may be emitted from the pixels. Therefore, to reduce or prevent the likelihood of the first semiconductor layer 1100 from being physically affected by the first groove 100GV of the substrate 100, when viewed in the direction (the z-axis direction) perpendicular to the substrate 100, the first semiconductor layer 1100 may be located within the mask layer 1010. In addition, through this, when the amorphous silicon layer is formed on the substrate 100 and is crystallized by irradiating an excimer laser beam or the like to the amorphous silicon layer to form a polysilicon layer, crystallization may be substantially uniformly performed in portions of the amorphous silicon layer positioned within the mask layer 1010.

Because the driving transistor T1, the switching transistor T2, the operation control transistor T5, the emission control transistor T6, and the second initialization transistor T7 may be PMOS, as described above, in this case, these thin-film transistors may be located along the first semiconductor layer 1100 shown in FIG. 5. In addition, the first semiconductor layer 1100 may have a shape extending in a first direction (+y direction) as a whole.

The first gate-insulating layer 113 may be located over the substrate 100 and cover the first semiconductor layer 1100. The first gate-insulating layer 113 may include an insulating material. For example, the first gate-insulating layer 113 may include an inorganic insulating material, such as silicon oxide, silicon nitride, silicon oxynitride, aluminum oxide, titanium oxide, tantalum oxide, hafnium oxide, and/or zinc oxide.

The first gate layer 1200 shown in FIG. 6 may be located on the first gate-insulating layer 113. In FIG. 6, the first semiconductor layer 1100 is shown together with the first gate layer 1200, for convenience of description. The first gate layer 1200 may include a first gate line 1210, a first gate electrode 1220, and a second gate line 1230.

The first gate line 1210 may extend in a second direction (+x direction). The first gate line 1210 may be the first scan line SL1 or the next scan line SLn in FIG. 2. In other words, in the first pixel P1 shown in FIG. 6, the first gate line 1210 may correspond to the first scan line SL1 in FIG. 2, and in a pixel adjacent to the first pixel P1 in the first direction (+y direction), the first gate line 1210 may correspond to the next scan line SLn in FIG. 2. Accordingly, the first scan signal Sn and the next scan signal Sn+1 may be applied to the pixels through the first gate line 1210. Portions of the first gate line 1210 overlapping the first semiconductor layer 1100 may include the switching gate electrode of the switching transistor T2 and the second initialization gate electrode of the second initialization transistor T7.

The first gate electrode 1220 may have an isolated shape. The first gate electrode 1220 may include the driving gate electrode of the driving transistor T1. For reference, a portion of the first semiconductor layer 1100 overlapping the first gate electrode 1220 and a portion therearound may be referred to as a driving semiconductor layer.

The second gate line 1230 may extend in the second direction (+x direction). The second gate line 1230 may correspond to the emission control line EL in FIG. 2. Portions of the second gate line 1230 overlapping the first semiconductor layer 1100 may include the operation control gate electrode of the operation control transistor T5 and the emission control gate electrode of the emission control transistor T6. The emission control signal En may be applied to the pixels through the second gate line 1230.

The first gate layer 1200 may include a metal, an alloy, a conductive metal oxide, a transparent conductive material, or the like. For example, the first gate layer 1200 may include silver (Ag), an Ag-containing alloy, molybdenum (Mo), a Mo-containing alloy, aluminum (Al), an Al-containing alloy, an aluminum nitride (AlN), tungsten (W), a tungsten nitride (WN), copper (Cu), nickel (Ni), chromium (Cr), a chromium nitride (CrN), titanium (Ti), tantalum (Ta), platinum (Pt), scandium (Sc), an indium tin oxide (ITO), an indium zinc oxide (IZO), or the like. The first gate layer 1200 may have a multi-layer structure, such as a two-layer structure of a Mo layer and an Al layer, or a three-layer structure of a Mo layer, an Al layer, and another Mo layer.

A second gate-insulating layer 115 may be located on the first gate-insulating layer 113 and cover the first gate layer 1200. The second gate-insulating layer 115 may include the same/similar insulating material as/to the first gate-insulating layer 113.

A second gate layer 1300 shown in FIG. 7 may be located on the second gate-insulating layer 115. The second gate layer 1300 may include a third gate line 1310, a fourth gate line 1320, a capacitor upper electrode 1330, and a first initialization voltage line 1340 (i.e., the first initialization voltage line VL1 in FIG. 2).

The third gate line 1310 may extend in the second direction (+x direction). The third gate line 1310 may correspond to the previous scan line SLp in FIG. 2. When viewed in the direction (the z-axis direction) perpendicular to the substrate 100, the third gate line 1310 may be apart from the first gate line 1210. The previous scan signal Sn−1 may be applied to the pixels through the third gate line 1310. A portion of the third gate line 1310 overlapping a second semiconductor layer 1400 to be described below may include a first initialization lower gate electrode of the first initialization transistor T4.

The fourth gate line 1320 may also extend in the second direction (+x direction). The fourth gate line 1320 may correspond to the second scan line SL2 in FIG. 2. When viewed in the direction (the z-axis direction) perpendicular to the substrate 100, the fourth gate line 1320 may be apart from the first gate line 1210 and the third gate line 1310. The second scan signal Sn' may be applied to the pixels through the fourth gate line 1320. A portion of the fourth gate line 1320 overlapping the second semiconductor layer 1400 to be described below may include a compensation lower gate electrode of the compensation transistor T3.

The third gate line 1310 and the fourth gate line 1320 may be located under the second semiconductor layer 1400 to be described below with reference to FIG. 8 and may function as gate electrodes and also as lower protective metals for protecting portions of the second semiconductor layer 1400 overlapping the third gate line 1310 and the fourth gate line 1320.

The capacitor upper electrode 1330 may overlap the first gate electrode 1220 and extend in the second direction (+x direction). The capacitor upper electrode 1330 described above may constitute the storage capacitor Cst together with the first gate electrode 1220, to correspond to the second capacitor electrode CE2 in FIG. 2. The driving voltage ELVDD may be applied to the capacitor upper electrode 1330. In addition, a hole passing through the capacitor upper electrode 1330 may be defined in the capacitor upper electrode 1330, and at least a portion of the first gate electrode 1220 may overlap the hole.

The first initialization voltage line 1340 corresponding to the first initialization voltage line VL1 in FIG. 2 may extend in the second direction (+x direction). When viewed in the direction (the z-axis direction) perpendicular to the substrate 100, the first initialization voltage line 1340 may be apart from the third gate line 1310. The first initialization voltage Vint1 may be applied to the pixels through the first initialization voltage line 1340. The first initialization voltage line 1340 may at least partially overlap the second semiconductor layer 1400 to be described below and may be configured to apply the first initialization voltage line Vint1 to the second semiconductor layer 1400. The first initialization voltage line 1340 may be electrically connected to the second semiconductor layer 1400 through contact holes 1680CNT1, 1680CNT2, and 1680CNT3 to be described below with reference to FIG. 10.

The second gate layer 1300 may include a metal, an alloy, a conductive metal oxide, a transparent conductive material, or the like. For example, the second gate layer 1300 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, or IZO. The second gate layer 1300 may have a multi-layer structure, such as a two-layer structure of a Mo layer and an Al layer, or a three-layer structure of a Mo layer, an Al layer, and another Mo layer.

A first interlayer insulating layer 117 may be located on the second gate-insulating layer 115 and cover the second gate layer 1300. The first interlayer insulating layer 117 may include an insulating material. For example, the first interlayer insulating layer 117 may include silicon oxide, silicon nitride, silicon oxynitride, aluminum oxide, titanium oxide, tantalum oxide, hafnium oxide, and/or zinc oxide.

The second semiconductor layer 1400 shown in FIG. 8 may be located on the first interlayer insulating layer 117. The second semiconductor layer 1400 may include an oxide semiconductor. For example, the second semiconductor layer 1400 may include a Zn oxide-based material, specifically Zn oxide, In—Zn oxide, or Ga—In—Zn oxide. Various modifications may be made, and the second semiconductor layer 1400 may include oxide semiconductor, such as In—Ga—Zn—O (IGZO), In—Sn—Zn—O (ITZO), or In—Ga—Sn—Zn—O (IGTZO), in which metals, such as indium (In), gallium (Ga), and/or tin (Sn) are contained in ZnO.

The second semiconductor layer 1400 may be located on a layer different from a layer on which the first semiconductor layer 1100 is located, and may not overlap the first semiconductor layer 1100 when viewed in the direction (the z-axis direction) perpendicular to the substrate 100.

The third gate-insulating layer 118 may be located on the first interlayer insulating layer 117 and cover the second semiconductor layer 1400. The third gate-insulating layer 118 may include an insulating material. However, if suitable, the third gate-insulating layer 118 may be located only on a portion of the second semiconductor layer 1400 and not on the first interlayer insulating layer 117. In this case, the third gate-insulating layer 118 may have the same pattern as a third gate layer 1500 to be described below with reference to FIG. 9. In other words, when viewed in the direction (the z-axis direction) perpendicular to the substrate 100, the third gate-insulating layer 118 may completely or almost completely overlap the third gate layer 1500. This may be implemented by concurrently or substantially simultaneously patterning the third gate-insulating layer 118 and the third gate layer 1500. In this case, in the second semiconductor layer 1400, source regions and drain regions may not be covered with the third gate-insulating layer 118 except for channel regions overlapping the third gate layer 1500. Accordingly, the source regions and the drain regions may be in direct contact with the second interlayer insulating layer 119. The third gate-insulating layer 118 may include silicon oxide, silicon nitride, silicon oxynitride, aluminum oxide, titanium oxide, tantalum oxide, hafnium oxide, and/or zinc oxide.

The third gate layer 1500 shown in FIG. 9 may be located on the third gate-insulating layer 118. The third gate layer 1500 may include a fifth gate line 1520 and a sixth gate line 1530.

The fifth gate line 1520 may extend in the second direction (+x direction). When viewed in the direction (the z-axis direction) perpendicular to the substrate 100, the fifth gate line 1520 may overlap the third gate line 1310. A portion of the fifth gate line 1520 overlapping the second semiconductor layer 1400 may include a first initialization upper gate electrode of the first initialization transistor T4. A portion of the second semiconductor layer 1400 overlapping the fifth gate line 1520 and a portion therearound may be referred to as a first initialization semiconductor layer. The fifth gate line 1520 may be electrically connected to the third gate line 1310. For example, the fifth gate line 1520 may be electrically connected to the third gate line 1310 through a contact hole defined in an insulating layer between the fifth gate line 1520 and the third gate line 1310. The contact hole may be located in the display area DA or may be located in the peripheral area PA. Accordingly, the fifth gate line 1520 may correspond to the previous scan line SLp of FIG. 2 together with the third gate line 1310. The previous scan signal Sn−1 may be applied to pixels through the fifth gate line 1520 and/or the third gate line 1310.

The sixth gate line 1530 may extend in the second direction (+x direction). When viewed in the direction (the z-axis direction) perpendicular to the substrate 100, the sixth gate line 1530 may overlap the fourth gate line 1320. A portion of the sixth gate line 1530 overlapping the second semiconductor layer 1400 may include a compensation upper gate electrode of the compensation transistor T3. The sixth gate line 1530 may be electrically connected to the fourth gate line 1320. For example, the sixth gate line 1530 may be electrically connected to the fourth gate line 1320 through a contact hole defined in an insulating layer between the sixth gate line 1530 and the fourth gate line 1320. The contact hole may be located in the display area DA or may be located in the peripheral area PA. Accordingly, the sixth gate line 1530 may correspond to the second scan line SL2 of FIG. 2 together with the fourth gate line 1320. The second scan signal Sn' may be applied to pixels through the sixth gate line 1530 and/or the fourth gate line 1320.

The third gate layer 1500 may include a metal, an alloy, a conductive metal oxide, a transparent conductive material, or the like. For example, the third gate layer 1500 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The third gate layer 1500 may have a multi-layer structure, such as a two-layer structure of a Mo layer and an Al layer, or a three-layer structure of a Mo layer, an Al layer, and another Mo layer.

The second interlayer insulating layer 119 may cover at least a portion of the third gate layer 1500 in FIG. 9. The second interlayer insulating layer 119 may include an insulating material. For example, the second interlayer insulating layer 119 may include silicon oxide, silicon nitride, silicon oxynitride, aluminum oxide, titanium oxide, tantalum oxide, hafnium oxide, and/or zinc oxide.

The first source drain layer 600 shown in FIG. 10 may be located on the second interlayer insulating layer 119. The first source drain layer 1600 may include a first connection electrode 1620, a second connection electrode 1610, a second initialization voltage line 1630, a third connection electrode 1670, a fourth connection electrode 1640, a fifth connection electrode 1650, and a sixth connection electrode 1680.

The first connection electrode 1620 may be electrically connected to the first semiconductor layer 1100 through a contact hole 1620CNT. A data signal Dm from a data line 1710 to be described below with reference to FIG. 11 may be transmitted to the first semiconductor layer 1100 through the first connection electrode 1620 and applied to the switching transistor T2.

The second initialization voltage line 1630 may extend in the second direction (+x direction). The second initialization voltage line 1630, which corresponds to the second initialization voltage line VL2 in FIG. 2, may be configured to apply the second initialization voltage Vint2 to the pixels. The second initialization voltage line 1630 may be electrically connected to the first semiconductor layer 1100 through a contact hole 1630CNT so that the second initialization voltage Vint2 may be transmitted to the first semiconductor layer 1100 and applied to the second initialization transistor T7.

A driving voltage ELVDD from a driving power supply line 1730 to be described below with reference to FIG. 11 is transmitted to the second connection electrode 1610. The second connection electrode 1610 electrically connected to the first semiconductor layer 1100 through a contact hole 1610CNT1 may transmit the driving voltage ELVDD to the first semiconductor layer 1100, specifically, the operation control transistor T5. In addition, the second connection electrode 1610 electrically connected to the capacitor upper electrode 1330 (i.e., the second capacitor electrode CE2 of FIG. 2) through a contact hole 1610CNT2, which is an additional contact hole, may transmit the driving voltage ELVDD to the capacitor upper electrode 1330.

The second connection electrode 1610 may extend in the second direction (+x direction) and may be integrally formed as a single body with respect to the first pixel P1 and the second pixel P2. However, the second connection electrode 1610 is not integrally formed as a single body with respect to all pixels in the second direction (+x direction), and may have an isolated shape, as shown in FIG. 10. Through this, as described below, through holes may be formed in the inorganic insulating layer.

The third connection electrode 1670 may be electrically connected to the first semiconductor layer 1100 through a contact hole 1670CNT. The third connection electrode 1670 may transmit a driving current or a second initialization voltage Vint2 from the first semiconductor layer 1100 to the organic light emitting diode OLED.

The fourth connection electrode 1640 is electrically connected to the second semiconductor layer 1400 through a contact hole 1640CNT1 formed on one side of the fourth connection electrode 1640. In addition, the fourth connection electrode 1640 is electrically connected to the first gate electrode 1220, which is a driving gate electrode, through a contact hole 1640CNT2 formed on the other side of the fourth connection electrode 1640 and passing through an opening 1330-OP of the capacitor upper electrode 1330. Accordingly, the fourth connection electrode 1640 may electrically connect the first initialization semiconductor layer, which is a portion of the second semiconductor layer 1400, to the driving gate electrode. The first initialization voltage Vint1 may be transmitted to the first gate electrode 1220, which is a driving gate electrode, through the second semiconductor layer 1400 and the fourth connection electrode 1640.

The fifth connection electrode 1650 may electrically connect the second semiconductor layer 1400 and the first semiconductor layer 1100 to each other through contact holes 1650CNT1 and 1650CNT2 defined at one side and the other side of the fifth transmission line 1650. In other words, the fifth connection electrode 1650 may electrically connect the compensation transistor T3 and the driving transistor T1 to each other.

The sixth connection electrode 1680 may be electrically connected to the second semiconductor layer 1400 through contact holes 1680CNT2 and 1680CNT3. In addition, the sixth connection electrode 1680 may be electrically connected to the first initialization voltage line 1340 in FIG. 7 through a contact hole 1680CNT1. Accordingly, the sixth connection electrode 1680 may be configured to transmit the first initialization voltage Vint1 from the first initialization voltage line 1340 to the first initialization transistor T4.

The first source drain layer 1600 may include a metal, an alloy, a conductive metal oxide, a transparent conductive material, or the like. For example, the first source drain layer 1600 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The first source drain layer 1600 may have a multi-layer structure, such as a two-layer structure of a Ti layer and an Al layer, or a three-layer structure of a Ti layer, an Al layer, and another Ti layer.

A first planarization layer 121 may be located on the second interlayer insulating layer 119 and cover the first source drain layer 1600. The first planarization layer 121 may include an organic insulating material. For example, the first planarization layer 121 may include photoresist, benzocyclobutene (BCB), hexamethyldisiloxane (HMDSO), polymethylmethacrylate (PMMA), polystyrene, a polymer derivative having a phenol-based group, an acryl-based polymer, an imide-based polymer (e.g., polyimide), an aryl ether-based polymer, an amide-based polymer, a fluorine-based polymer, a p-xylene-based polymer, a vinyl alcohol-based polymer, or any blends thereof.

The second source drain layer 1700 shown in FIG. 11 may be located on the first planarization layer 121. The second source drain layer 1700 may include a data line 1710, a driving power supply line 1730, and an upper connection electrode 1740.

The data line 1710 may extend in a first direction (+y direction). The data line 1710 may correspond to the data line DL of FIG. 2. The data line 1710 may be electrically connected to the first connection electrode 1620 through a contact hole 1710CNT, and a data signal Dm from the data line 1710 may be transmitted to the first semiconductor layer 1100 through the first connection electrode 1620 and applied to the switching transistor T2.

The driving power supply line 1730 may extend substantially in the first direction (+y direction). The driving power supply line 1730 may correspond to the driving voltage supply line PL of FIG. 2. The driving power supply line 1730 may apply the driving voltage ELVDD to the pixels. The driving power supply line 1730 may be electrically connected to the second connection electrode 1610 through a contact hole 1730CNT, and thus, as described above, the driving voltage ELVDD may be transmitted to the operation control transistor T5 and the capacitor upper electrode 1330. The driving power supply line 1730 of the first pixel circuit PC1 may be formed integrally with the driving power supply line 1730 of the second pixel circuit PC2 adjacent thereto.

The upper connection electrode 1740 is electrically connected to the third connection electrode 1670 through a contact hole 1740CNT1. The upper connection electrode 1740 is connected to the pixel electrode 211 through a contact hole 1740CNT2 formed in an insulating layer located on the upper connection electrode 1740. Accordingly, a driving current or a second initialization voltage Vint2 from the first semiconductor layer 1100 may be transmitted to the pixel electrode 211 of the organic light-emitting diode OLED through the third connection electrode 1670 and the upper connection electrode 1740.

The second source drain layer 1700 may include a metal, an alloy, a conductive metal oxide, a transparent conductive material, or the like. For example, the second source drain layer 1700 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The second source drain layer 1700 may have a multi-layer structure, such as a two-layer structure of a Ti layer and an Al layer, or a three-layer structure of a Ti layer, an Al layer, and another Ti layer.

A second planarization layer 123 may be located on the first planarization layer 121 and cover the second source drain layer 1700. The second planarization layer 123 may include an organic insulating material. For example, the second planarization layer 123 may include photoresist, BCB, polyimide, HMDSO, PMMA, polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blends thereof.

An organic light-emitting diode OLED may be located on the second planarization layer 123. FIG. 12 shows that the organic light-emitting diode OLED includes a pixel electrode 211, an intermediate layer 221 including an emission layer, and an opposite electrode 230.

The pixel electrode 211 may include a (semi-)light-transmitting electrode or a reflective electrode. For example, the pixel electrode 211 may include a reflective layer and a transparent or semi-transparent electrode layer located on the reflective layer, the reflective layer including Ag, magnesium (Mg), Al, Pt, palladium (Pd), gold (Au), Ni, neodymium (Nd), iridium (Ir), Cr, and a compound thereof. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 211 may have a three-layer structure of an ITO layer, an Ag layer, and another ITO layer.

A pixel-defining layer 125 may be located on the second planarization layer 123. The pixel-defining layer 125 may reduce or prevent the likelihood of an arc or the like occurring at the edge of the pixel electrode 211 by increasing a distance between the edge of the pixel electrode 211 and the opposite electrode 230 above the pixel electrode 211. In other words, the pixel-defining layer 125 may have a pixel opening 1250P to expose a central portion of the pixel electrode 211. The pixel-defining layer 125 may include one or more organic insulating materials selected from the group consisting of polyimide, polyamide, an acryl-based resin, BCB, and a phenolic resin, and may be formed by a method, such as spin coating.

At least a portion of the intermediate layer 221 of the organic light-emitting diode OLED, the intermediate layer 221 including an emission layer, may be located in the pixel opening 1250P defined by the pixel-defining layer 125. An emission area of the organic light-emitting diode OLED may be defined by the pixel opening 1250P.

As described above, the intermediate layer 221 may include an emission layer. The emission layer may include an organic material including a fluorescent or phosphorous material emitting red, green, blue, or white light. The emission layer may include a low-molecular weight organic material or a polymer organic material, and a functional layer, such as a hole transport layer (HTL), a hole injection layer (HIL), an electron transport layer (ETL), an electron injection layer (EIL), or a quantum dot layer may selectively be further located below and/or over the emission layer.

The emission layer may have a patterned shape to correspond to each of the pixel electrodes 211. A layer included in the intermediate layer 221 except for the emission layer may be integrally formed as a single body over pixel electrodes 211, and various modifications may be made.

The opposite electrode 230 may be a light-transmitting electrode or a reflective electrode. For example, the opposite electrode 230 may be a transparent or semi-transparent electrode and may include a metal thin film having a low work function, which includes lithium (Li), calcium (Ca), Al, Ag, Mg, In, ytterbium (Yb), or a compound thereof (e.g., lithium fluoride (LiF)). In addition, the opposite electrode 230 may further include a transparent conductive oxide (TCO) layer, which may include ITO, IZO, ZnO, $ZnO_2$, $In_2O_3$, or the like. The opposite electrode 230 may be integrally formed as a single body throughout the entire surface of the display area DA and may be located over the intermediate layer 221 and the pixel-defining layer 125.

The display apparatus has a valley VLY as shown in FIG. 13. This valley VLY may be formed by through holes ILTH formed in the first gate-insulating layer 113, the second gate-insulating layer 115, the first interlayer insulating layer 117, the third gate-insulating layer 118, and the second interlayer insulating layer 119. These insulating layers may be called as an inorganic insulating layer, collectively.

As described above, the mask layer 1010 has a plurality of openings 1010OP, and accordingly, the substrate 100 located below the mask layer 1010 has a plurality of first grooves 100GV corresponding to the plurality of openings 1010OP of the mask layer 1010. The through holes ILTH formed in the inorganic insulating layer located over the mask layer 1010 correspond to at least some of the plurality of openings 1010OP of the mask layer 1010. In addition, the first planarization layer 121, which is an organic insulating layer including an organic insulating material located on the inorganic insulating layer, fills the through holes ILTH.

When an impact is applied to the display apparatus from the outside, cracks may occur in the inorganic insulating layer including an inorganic material inside the display apparatus. Furthermore, such cracks generated in a pixel area may grow along the inorganic insulating layer including the inorganic material inside the display apparatus, and may extend to a neighboring pixel area. Accordingly, defects may occur in a plurality of pixels.

However, the display apparatus may prevent or reduce the growth of such cracks. As described above, the inorganic insulating layer included in the display apparatus includes the through holes ILTH, and the first planarization layer 121, which is an organic insulating layer including an organic insulating material located on the inorganic insulating layer, fills the through holes ILTH. Therefore, even though a crack is generated in the inorganic insulating layer in a pixel area by an impact from the outside and the crack grows through the inorganic insulating layer, the crack reaches the through holes ILTH of the inorganic insulating layer, and thus, the crack no longer grows into another pixel area. As described above, the display apparatus may effectively reduce, minimize, or prevent the likelihood of a crack formed in an inorganic insulating layer in a pixel due to impact from the outside, from growing into a neighboring pixel.

For example, in the case of the display apparatus according to one or more embodiments described above, the substrate 100 has a plurality of first grooves 100GV corresponding to the plurality of openings 1010OP of the mask layer 1010. Accordingly, the depths of the through holes ILTH of the inorganic insulating layer located over the substrate 100 and corresponding to at least some of the plurality of first grooves 100GV may be further increased. As a result, the effect of reducing crack growth may be further increased by the through holes ILTH.

Figure 15:
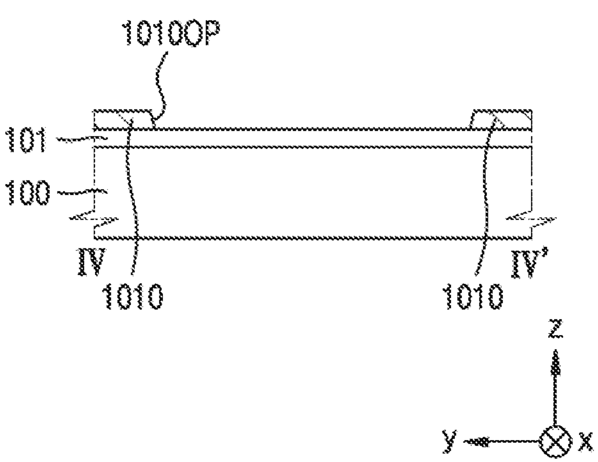
FIGS. 15 and 16 are cross-sectional views schematically illustrating a process of manufacturing the display apparatus shown in FIG. 3.
Figure 16:
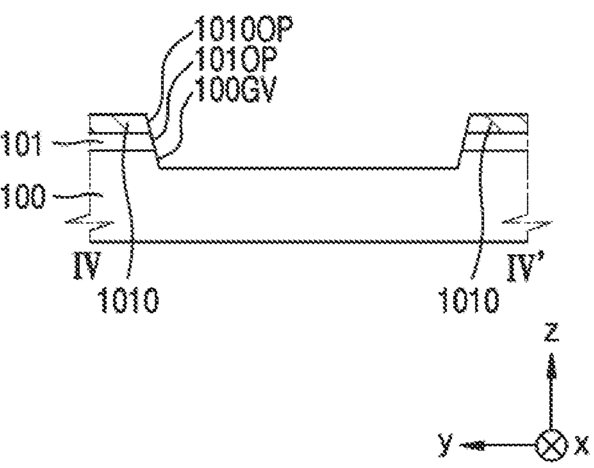

FIGS. 15 and 16 are cross-sectional views schematically illustrating a process of manufacturing the display apparatus shown in FIG. 3. First, a bonding layer 101 and a mask layer 1010 are sequentially formed on the substrate 100. Thereafter, as shown in FIG. 15, a plurality of openings 1010OP are formed in the mask layer 1010 through patterning using photoresist, and the photoresist is removed. A dry etching process may be used for the patterning. After the mask layer 1010 having the openings 1010OP is formed, dry etching is performed using the mask layer 1010 as a mask to thereby concurrently or substantially simultaneously patterning the bonding layer 101 and the substrate 100, as shown in FIG. 16. Accordingly, a plurality of additional openings 101OP may be formed in the bonding layer 101, and a plurality of first grooves 100GV corresponding to the plurality of additional openings 101OP may be formed in the substrate 100.

Because the plurality of first grooves 100GV are formed in the substrate 100 through this process, when viewed in a direction (z-axis direction) perpendicular to the substrate 100, the plurality of openings 1010OP of the mask layer 1010, the plurality of first grooves 100GV of the substrate 100, and the plurality of additional openings 101OP of the bonding layer 101 may overlap one another. Furthermore, the plurality of openings 1010OP of the mask layer 1010 may be in one-to-one correspondence with the plurality of first grooves 100GV of the substrate 100, and the plurality of openings 1010OP of the mask layer 1010 may be in one-to-one correspondence with the plurality of additional openings 101OP of the bonding layer 101. In addition, an inner side surface of each of the plurality of openings 1010OP of the mask layer 1010, an inner side surface of a corresponding one of the plurality of first grooves 100GV of the substrate 100, and an inner side surface of a corresponding one of the plurality of additional openings 101OP of the bonding layer 101 may form a continuous surface, as shown in FIGS. 13, 14, and 16.

As shown in FIGS. 13 and 14, when a portion of the inorganic insulating layer is removed to form the through holes ILTH in the inorganic insulating layer, a portion of the buffer layer 105 may also be removed at the same time. In other words, the buffer layer 105 located between the substrate 100 and the inorganic insulating layer may have second grooves 105GV, which correspond to the through holes ILTH of the inorganic insulating layer, in a portion of the buffer layer 105 in a direction (+z direction) toward the inorganic insulating layer. Accordingly, when viewed in a direction (the z-axis direction) perpendicular to the substrate 100, the second grooves 105GV of the buffer layer 105 may overlap the through holes ILTH of the inorganic insulating layer. Also, the second grooves 105GV of the buffer layer 105 may be in one-to-one correspondence with the through holes ILTH of the inorganic insulating layer. Furthermore, when a portion of the inorganic insulating layer is removed to form the through holes ILTH in the inorganic insulating layer, a portion of the buffer layer 105 is also removed at the same time to form the second grooves 105GV, and thus, an inner side surface of each of the second grooves 105GV of the buffer layer 105 and an inner side surface of a corresponding one of the through holes ILTH of the inorganic insulating layer may form a continuous surface.

As described above, the buffer layer 105 may control a heat supply rate during a crystallization process for forming the first semiconductor layer 1100 so that the first semiconductor layer 1100 is uniformly crystallized. As described above with reference to FIG. 3, when viewed in the direction (the z-axis direction) perpendicular to the substrate 100, the first semiconductor layer 1100 may be located within the mask layer 1010. Therefore, portions of the buffer layer 105 overlapping the plurality of openings 1010OP of the mask layer 1010 do not overlap the first semiconductor layer 1100. Therefore, even when the buffer layer 105 has the plurality of second grooves 105GV overlapping the plurality of openings 1010OP of the mask layer 1010, the plurality of second grooves 105GV do not affect the characteristics of the first semiconductor layer 1100.

In addition, by making the buffer layer 105 have the plurality of second grooves 105GV, the plurality of second grooves 105GV of the buffer layer 105 may form deep valleys VLY as shown in FIG. 13 together with the through holes ILTH of the inorganic insulating layer. As the depth of the valleys VLY increases in this way, it is possible to effectively reduce, minimize, or prevent the likelihood of a crack formed in the inorganic insulating layer in a pixel due to external impact, from growing into a neighboring pixel. In this case, the first planarization layer 121, which is an organic insulating layer that fills the through holes ILTH of the inorganic insulating layer, may fill not only the through holes ILTH but also the second grooves 105GV of the buffer layer 105 and contact the bottom surface of each of the second grooves 105GV.

A barrier layer 103 may be located between the substrate 100 and the inorganic insulating layer, specifically, between the substrate 100 and the buffer layer 105, as described above. The barrier layer 103 may reduce or prevent diffusion of metal atoms or impurities from the substrate 100 toward the first semiconductor layer 1100 located thereon. Therefore, unlike the buffer layer 105 having the second grooves 105GV, the barrier layer 103 may have a constant thickness throughout the entire area. This is because if the barrier layer 103 has a portion where the thickness is reduced, impurities from the substrate 100 may penetrate into the first semiconductor layer 1100 through the portion, thereby causing defects.

As the display apparatus has such a structure, portions of the barrier layer 103 corresponding to the first grooves 100GV of the substrate 100 may be located in the first grooves 100GV of the substrate 100, as shown in FIG. 13. Similarly, portions of the buffer layer 105 corresponding to the first grooves 100GV of the substrate 100 may be located in the first grooves 100GV of the substrate 100, as shown in FIG. 13. Accordingly, a distance t2 from the bottom surface of each of the second grooves 105GV of the buffer layer 105 in a direction (−z direction) toward the substrate 100 to the bottom surface of the substrate 100 may be less than a thickness t1 of the substrate 100. As a result, as described above, the plurality of second grooves 105GV of the buffer layer 105 may form deep valleys VLY as shown in FIG. 13 together with the through holes ILTH of the inorganic insulating layer. In addition, as shown in FIG. 13, in portions of the buffer layer 105 within the first grooves 100GV of the substrate 100 and outside the second grooves 105GV, a distance t3 from the upper surface of the buffer layer 105 to the bottom surface of the substrate 100 may also be less than the thickness t1 of the substrate 100.

Figure 17:
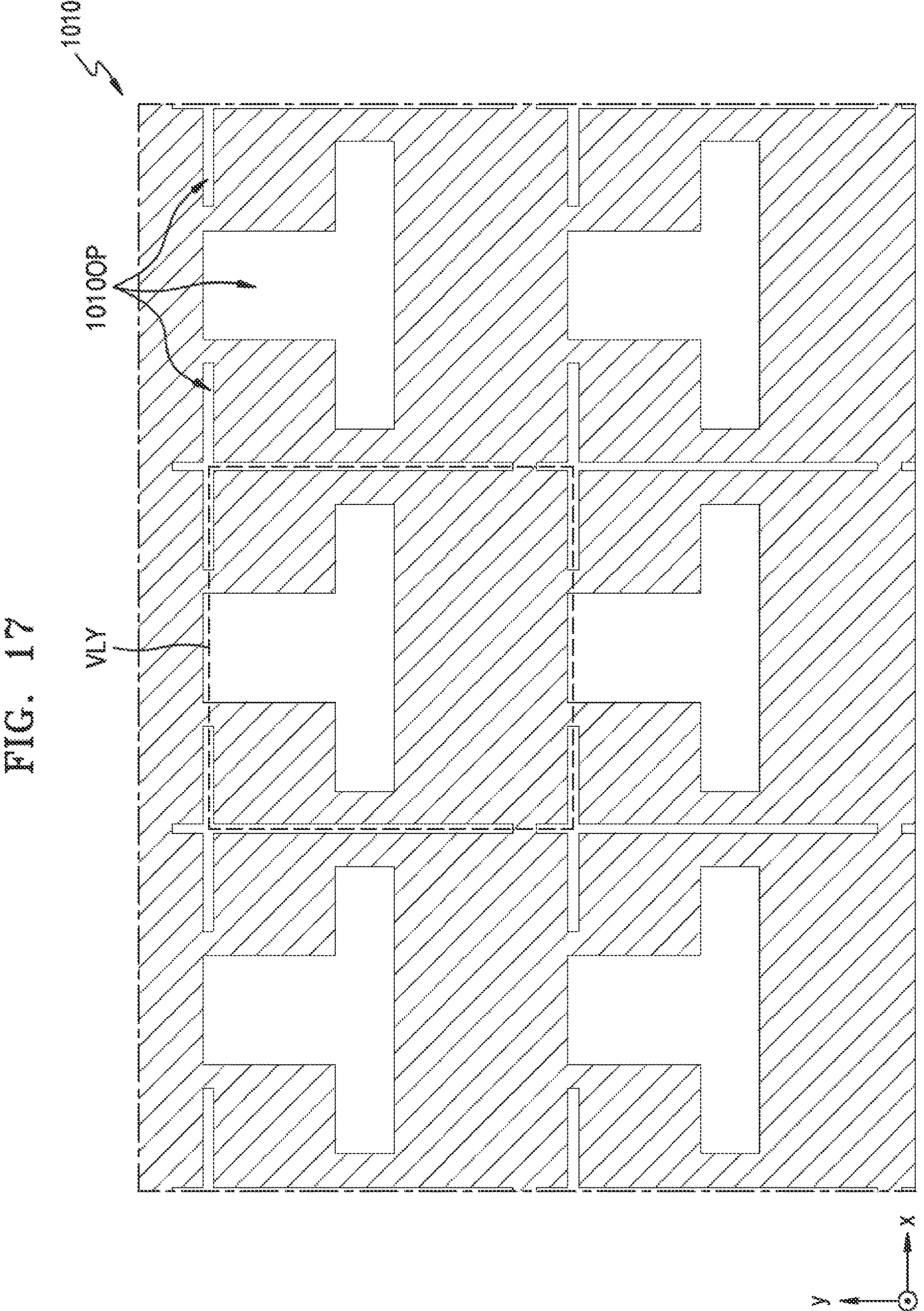
FIG. 17 is a plan view schematically illustrating the overall appearance of a mask layer included in the display apparatus shown in FIG. 3.

FIG. 17 is a plan view schematically illustrating the overall appearance of the mask layer 1010 included in the display apparatus shown in FIG. 3. FIG. 3 schematically shows a pair of the first pixel P1 and the second pixel P2, and FIG. 4 shows the mask layer 1010 included in the pair, while FIG. 17 shows the mask layer 1010 included in six pairs of the first pixel P1 and the second pixel P2. As shown in FIG. 17, the mask layer 1010 has a plurality of openings 1010OP. The valleys VLY formed by the through holes ILTH of the inorganic insulating layer included in the display apparatus and the second grooves 105GV of the buffer layer 105 may have an approximate rectangular shape enclosing a pair of pixels in a plan view, as shown in FIG. 17.

As shown in a portion of FIG. 13, which is a cross-section taken along the line VI-VI' in FIG. 3, to reduce or prevent the likelihood of the first semiconductor layer 1100 being disconnected in pixels adjacent to each other in the first direction (the y-axis direction), the valleys VLY may not completely encircle the pair of the first pixel P1 and the second pixel P2. Similarly, to reduce or prevent the likelihood of the disconnection of the first gate line 1210 or the second gate line 1230 extending in the second direction (+x direction) as shown in FIG. 6, and the third gate line 1310, the fourth gate line 1320, and the first initialization voltage line 1340 extending in the second direction (+x direction) as shown in FIG. 7, the valleys VLY may not completely encircle the pair of the first pixel P1 and the second pixel P2. In addition, as shown in FIGS. 4 and 17, which are plan views, there is an opening 1010OP having a "T" shape inverted up and down at the center of a portion corresponding to the pair of the first pixel P1 and the second pixel P2 of the mask layer 1010, and thus, the substrate 100 may have a first groove 100GV having a "T" shape inverted up and down to overlap the opening 1010OP in a plan view. However, the inorganic insulating layer may not have a through hole ILTH having a "T" shape inverted up and down in a plan view, but may have through holes ILTH to correspond only to a portion of a line indicated by a valley VLY in a corresponding opening 10100P in FIG. 17.

When viewed in the direction (the z-axis direction) perpendicular to the substrate 100, the through holes ILTH of the inorganic insulating layer may extend along a line having a substantially rectangular shape indicated by a valley VLY in FIG. 17, and thus, each of the through holes ILTH may have a major axis and a minor axis, i.e., each of the through holes ILTH may has a shape extending in a major axis direction. A width W2 (in the y-axis direction) of the through hole ILTH shown in FIG. 13 may be referred to as a width W2 of the through hole ILTH in a minor axis direction crossing the major axis direction. This is because the through hole ILTH shown in a portion IV-IV' of FIG. 13 has a shape extending in the second direction (the x-axis direction). For reference, in FIG. 13, for convenience, the width (in the y-axis direction) of the second groove 105GV of the buffer layer 105, rather than the through hole ILTH of the inorganic insulating layer, is indicated by the reference numeral W2. In addition, in the lowermost portion of the through hole ILTH of the inorganic insulating layer in the direction (−z direction) toward substrate 100, the width (in the y-axis direction) of the lowermost portion may be substantially equal to the width (in the y-axis direction) of the second groove 105GV of the buffer layer 105.

Similarly, when viewed in the direction (the z-axis direction) perpendicular to the substrate 100, each of the first grooves 100GV corresponding to the through holes ILTH from among the first grooves 100GV of the substrate 100 may also have a major axis and a minor axis, i.e., each of the first grooves 100GV corresponding to the through holes ILTH from among the first grooves 100GV of the substrate 100 may have a shape extending in the major axis direction. The width W1 (in the y-axis direction) of the first groove 100GV shown in FIG. 13 may be referred to as the width W1 of the first groove 100GV in the minor axis direction crossing the major axis direction. As shown in FIG. 13, the width W2 may be less than the width W1. This is to allow the valleys VLY formed by the through holes ILTH of the inorganic insulating layer to be positioned within the first groove 100GV of the substrate 100 when viewed in the direction (the z-axis direction) perpendicular to the substrate 100 so that the depths of the valleys VLY may be sufficiently secured.

So far, it has been described that the mask layer 1010 serves as both a mask in the process of forming the first grooves 100GV in the substrate 100 and a bottom metal layer located under the first semiconductor layer 1100 to smoothly crystallize the first semiconductor layer 1100. However, the disclosure is not limited thereto.

Figure 18:
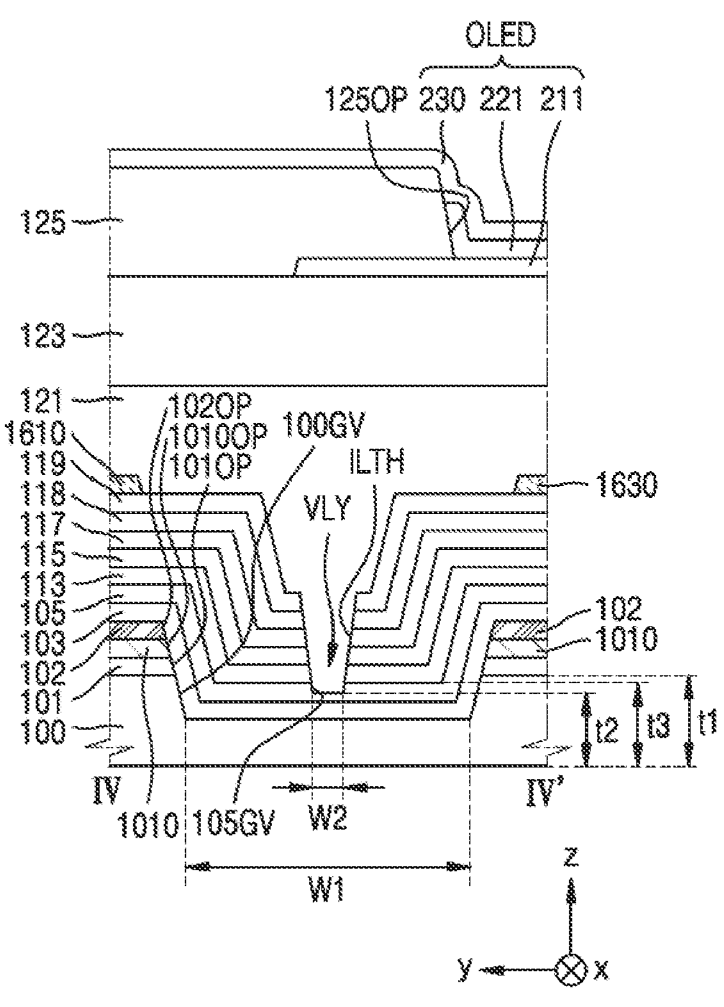
FIG. 18 is a cross-sectional view schematically illustrating a portion of a display apparatus according to one or more embodiments.

For example, as shown in FIG. 18 schematically illustrating a portion of a display apparatus according to one or more embodiments, the display apparatus may include a mask layer 1010 and a bottom metal layer 102 separately. In other words, as described above, after the mask layer 1010 is bonded to the upper surface (+z direction) of a substrate 100 by a bonding layer 101 and a plurality of openings 10100P are formed in the mask layer 1010, a plurality of additional openings 1010P of the bonding layer 101 and a plurality of first grooves 100GV of the substrate 100 may be formed to correspond to the plurality of openings 1010OP of the mask layer 1010 by using the mask layer 1010 as a mask. Then, the bottom metal layer 102 may be formed on the mask layer 1010, as shown in FIG. 18. In this case, the bottom metal layer 102 may have apertures, i.e., lower openings 1020P, corresponding to the plurality of openings 1010OP of the mask layer 1010. The bottom metal layer 102 may include a metal, such as molybdenum, silver, copper, or aluminum.

Although FIG. 18 shows that the inner side surface of each of the lower openings 1020P of the bottom metal layer 102 and the inner side surface of each of the openings 1010OP of the mask layer 1010 form a continuous surface, the disclosure is not limited thereto. For example, when viewed in a direction (the z-axis direction) perpendicular to the substrate 100, the area of the lower openings 1020P of the bottom metal layer 102 may be greater than the area of the openings 1010OP of the mask layer 1010.

Figure 19:
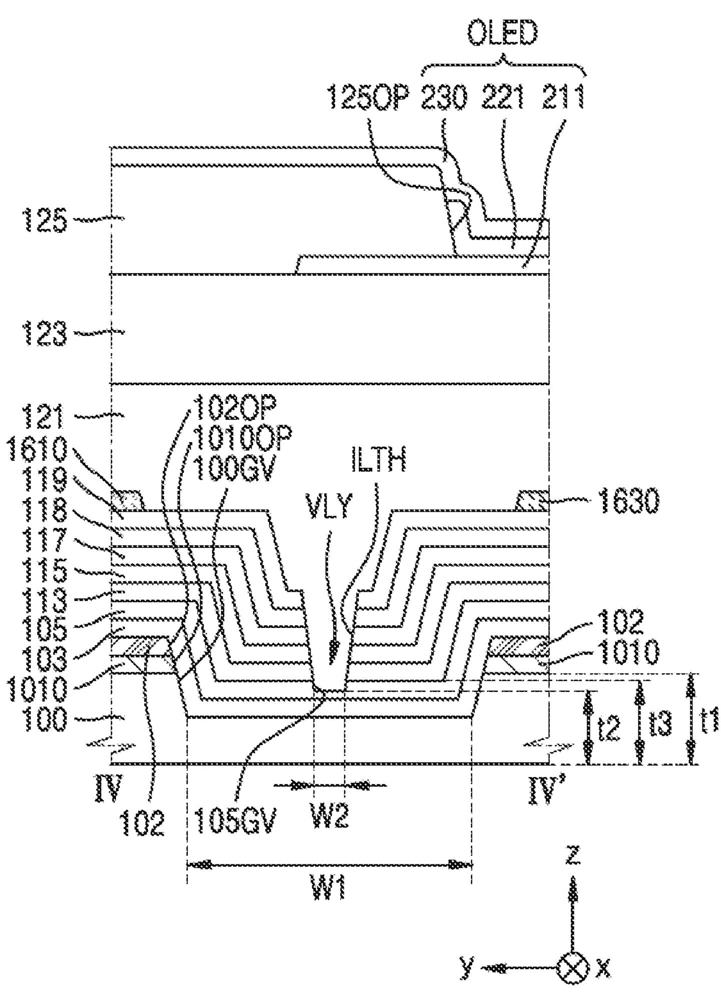
FIG. 19 is a cross-sectional view schematically illustrating a portion of a display apparatus according to one or more embodiments.

FIG. 19 is a cross-sectional view schematically illustrating a portion of a display apparatus according to one or more embodiments. In the case of the display apparatus according to one or more embodiments, a mask layer 1010 is located directly on the upper surface (+z direction) of a substrate 100. The mask layer 1010 may include an inorganic insulating material, such as aluminum oxide ($Al_2O_3$), and may be formed directly on the substrate 100 without an adhesive layer by using atomic layer deposition (ALD). By forming a layer including aluminum oxide on the substrate 100 and then patterning the layer using a photoresist or the like, the mask layer 1010 having a plurality of openings 1010OP may be formed directly on the substrate 100, as shown in FIG. 19. Also, by using the mask layer 1010 as a mask, a plurality of first grooves 100GV of the substrate 100 may be formed to correspond to the plurality of openings 10100P of the mask layer 1010. Then, a bottom metal layer 102 may be formed on the mask layer 1010, as shown in FIG. 19. In this case, the bottom metal layer 102 may have apertures, i.e., lower openings 1020P, corresponding to the plurality of openings 1010OP of the mask layer 1010. The bottom metal layer 102 may include a metal, such as molybdenum, silver, copper, or aluminum.

Although FIG. 19 shows that the inner side surface of each of the lower openings 1020P of the bottom metal layer 102 and the inner side surface of the corresponding one of the openings 1010OP of the mask layer 1010 form a continuous surface, the disclosure is not limited thereto. For example, when viewed in a direction (the z-axis direction) perpendicular to the substrate 100, the area of the lower openings 1020P of the bottom metal layer 102 may be greater than the area of the openings 1010OP of the mask layer 1010.

It goes without saying that most of the descriptions given above may be applied to the display apparatuses according to the embodiments shown in FIGS. 18 and 19.

For example, a distance t2 from the bottom surface of each of the second grooves 105GV of the buffer layer 105 in a direction (−z direction) toward the substrate 100 to the bottom surface of the substrate 100 may be less than a thickness t1 of the substrate 100. As a result, as described above, the plurality of second grooves 105GV of the buffer layer 105 may form deep valleys VLY as shown in FIGS. 18 and 19 together with the through holes ILTH of the inorganic insulating layer. In addition, as shown in FIGS. 18 and 19, in portions of the buffer layer 105 within the first grooves 100GV of the substrate 100 and outside the second grooves 105GV, a distance t3 from the upper surface of the buffer layer 105 to the bottom surface of the substrate 100 may also be less than the thickness t1 of the substrate 100.

In addition, when viewed in the direction (z-axis direction) perpendicular to the substrate 100, as shown in FIGS. 18 and 19, a width W2 of the through hole ILTH in the minor axis direction, which is a width W2 (in the y-axis direction) of the through hole ILTH of the inorganic insulating layer, may be less than a width W1 of the first groove 100GV in the minor axis direction, which is a width W1 (in the y-axis direction) of the first groove 100GV of the substrate 100. This is to allow the valleys VLY formed by the through holes ILTH of the inorganic insulating layer to be positioned within the first groove 100GV of the substrate 100 when viewed in the direction (the z-axis direction) perpendicular to the substrate 100 so that the depths of the valleys VLY may be sufficiently secured.

Figure 20:
FIG. 20 is a cross-sectional view schematically illustrating a structure of a display element that may be included in a display apparatus according to one or more embodiments.

FIG. 20 is a cross-sectional view schematically illustrating a structure of a display element that may be included in a display apparatus according to one or more embodiments. FIGS. 21 to 24 are cross-sectional views illustrating examples of a structure of a display element that may be included in a display apparatus according to one or more embodiments.

As shown in FIG. 20, an organic light-emitting diode OLED, which is a display element that may be included in a display apparatus according to one or more embodiments, may include a pixel electrode 211, an opposite electrode 230, and an intermediate layer 221 between the pixel electrode 211 (i.e., a first electrode (anode)) and the opposite electrode 230 (i.e., a second electrode (cathode)).

Structures of the pixel electrode 211 and the opposite electrode 230 and materials that may be included therein are the same as those described above. The intermediate layer 221 may include an emission layer, as described above. In addition, the intermediate layer 221 may include a first functional layer located below the emission layer and a second functional layer located over the emission layer. The first functional layer may include a hole transport layer, or may include a hole transport layer and a hole injection layer. The second functional layer located over the emission layer is an optional element. The second functional layer may include an electron transport layer and/or an electron injection layer.

In one or more embodiments, the intermediate layer 221 may include two or more emitting units sequentially stacked between the pixel electrode 211 and the opposite electrode 230, and a charge generation layer located between two emitting units. When the intermediate layer 221 includes an emitting unit and a charge generation layer, the organic light-emitting diode OLED may be a tandem light-emitting device. The organic light-emitting diode OLED may improve color purity and luminous efficiency of the display apparatus by having a stacked structure including a plurality of emitting units.

One emitting unit may include an emission layer, a first functional layer below the emission layer, and a second functional layer over the emission layer. The charge generation layer may include a negative charge generation layer and a positive charge generation layer. The luminous efficiency of the organic light-emitting diode OLED, which is a tandem light-emitting device including a plurality of emission layers, may be further increased by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 21:
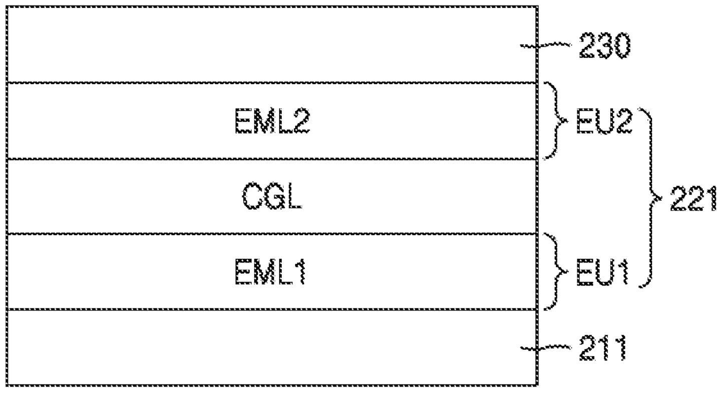
FIGS. 21 to 24 are cross-sectional views illustrating examples of a structure of a display element that may be included in a display apparatus according to one or more embodiments.

In one or more embodiments, as shown in FIG. 21, the organic light-emitting diode OLED may include a first emitting unit EU1 including a first emission layer EML1 and a second emitting unit EU2 including a second emission layer EML2, which are sequentially stacked. A charge generation layer CGL may be located between the first emitting unit EU1 and the second emitting unit EU2. For example, the organic light-emitting diode OLED may include a pixel electrode 211, a first emission layer EML1, a charge generation layer CGL, a second emission layer EML2, and an opposite electrode 230, which are sequentially stacked. A first functional layer and a second functional layer may be respectively located below and over the first emission layer EML1. A first functional layer and a second functional layer may also be respectively located below and over the second emission layer EML2. The first emission layer EML1 may be a blue emission layer, and the second emission layer EML2 may be a yellow emission layer.

Figure 22:
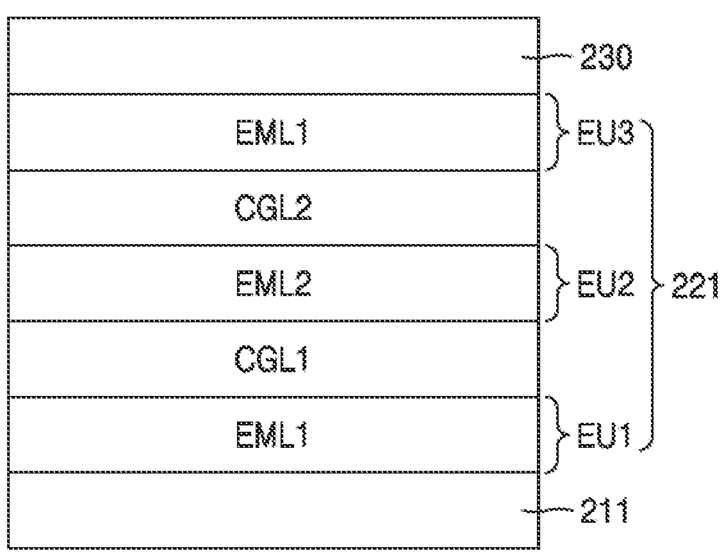

In one or more embodiments, as shown in FIG. 22, the organic light-emitting diode OLED may include a first emitting unit EU1 including a first emission layer EML1, a second emitting unit EU2 including a second emission layer EML2, and a third emitting unit EU3 including a first emission layer EML1. A first charge generation layer CGL1 may be located between the first emitting unit EU1 and the second emitting unit EU2, and a second charge generation layer CGL2 may be located between the second emitting unit EU2 and the third emitting unit EU3. For example, the organic light-emitting diode OLED may include a pixel electrode 211, a first emission layer EML1, a first charge generation layer CGL1, a second emission layer EML2, a second charge generation layer CGL2, a first emission layer EML1, and an opposite electrode 230, which are sequentially stacked. A first functional layer and a second functional layer may be respectively located below and over the first emission layer EML1. A first functional layer and a second functional layer may also be respectively located below and over the second emission layer EML2. The first emission layer EML1 may be a blue emission layer, and the second emission layer EML2 may be a yellow emission layer.

In one or more embodiments, the second emitting unit EU2 in the organic light-emitting diode OLED may further include a third emission layer EML3 and/or a fourth emission layer EML4, which is located below and/or over the second emission layer EML2 and directly contacts the second emission layer EML2, in addition to the second emission layer EML2. In this case, direct contact may mean that no other layer is located between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 23:
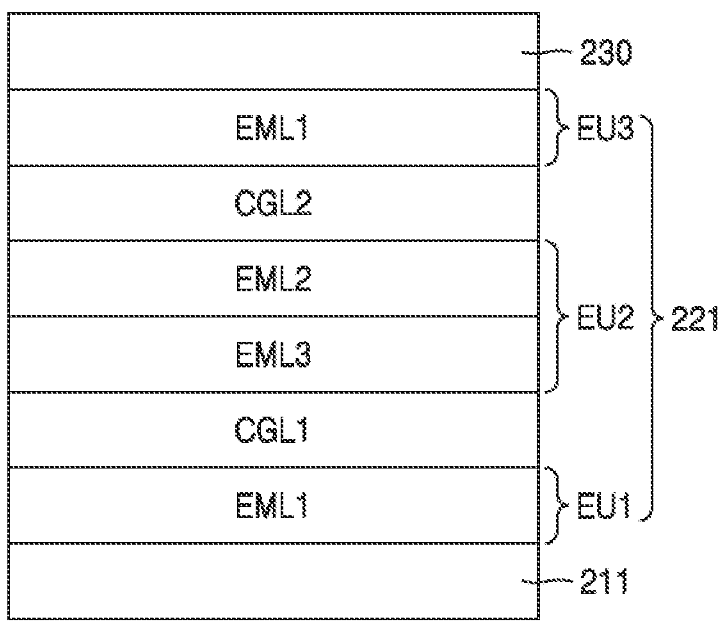

For example, as shown in FIG. 23, the organic light-emitting diode OLED may include a pixel electrode 211, a first emission layer EML1, a first charge generation layer CGL1, a third emission layer EML3, a second emission layer EML2, a second charge generation layer CGL2, a first emission layer EML1, and an opposite electrode 230, which are sequentially stacked. Alternatively, as shown in FIG. 24, the organic light-emitting diode OLED may include a pixel electrode 211, a first emission layer EML1, a first charge generation layer CGL1, a third emission layer EML3, a second emission layer EML2, a fourth emission layer EML4, a second charge generation layer CGL2, a first emission layer EML1, and an opposite electrode 230, which are sequentially stacked.

Figure 24:
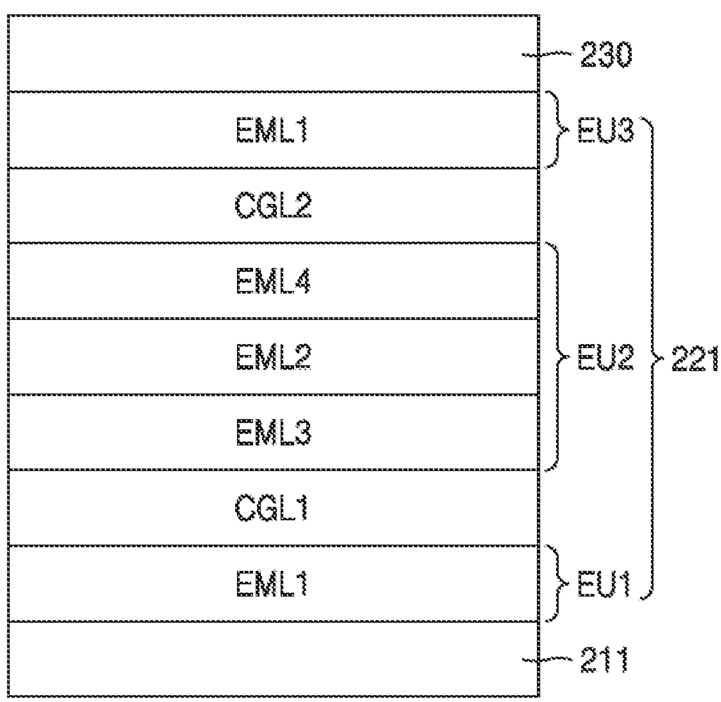
Figure 25:
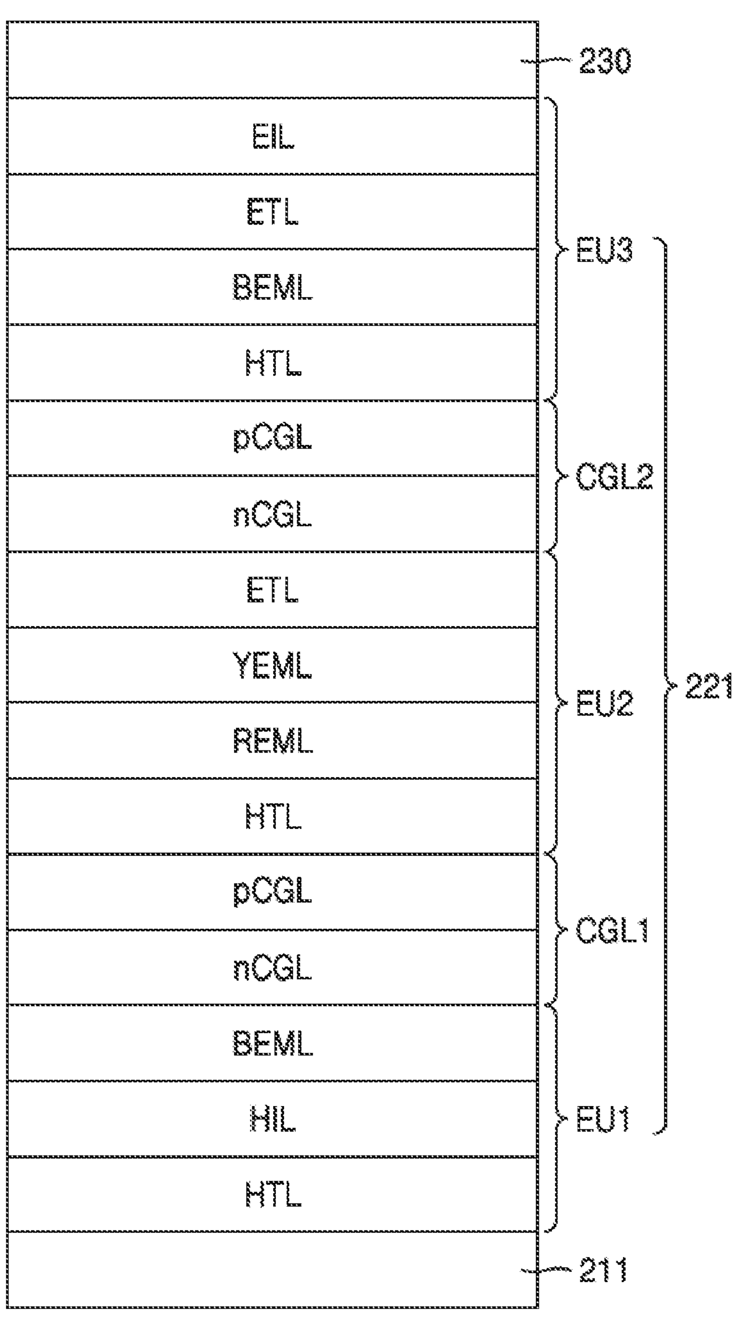
FIG. 25 is a cross-sectional view schematically illustrating an example structure of the display element of FIG. 23.
Figure 26:
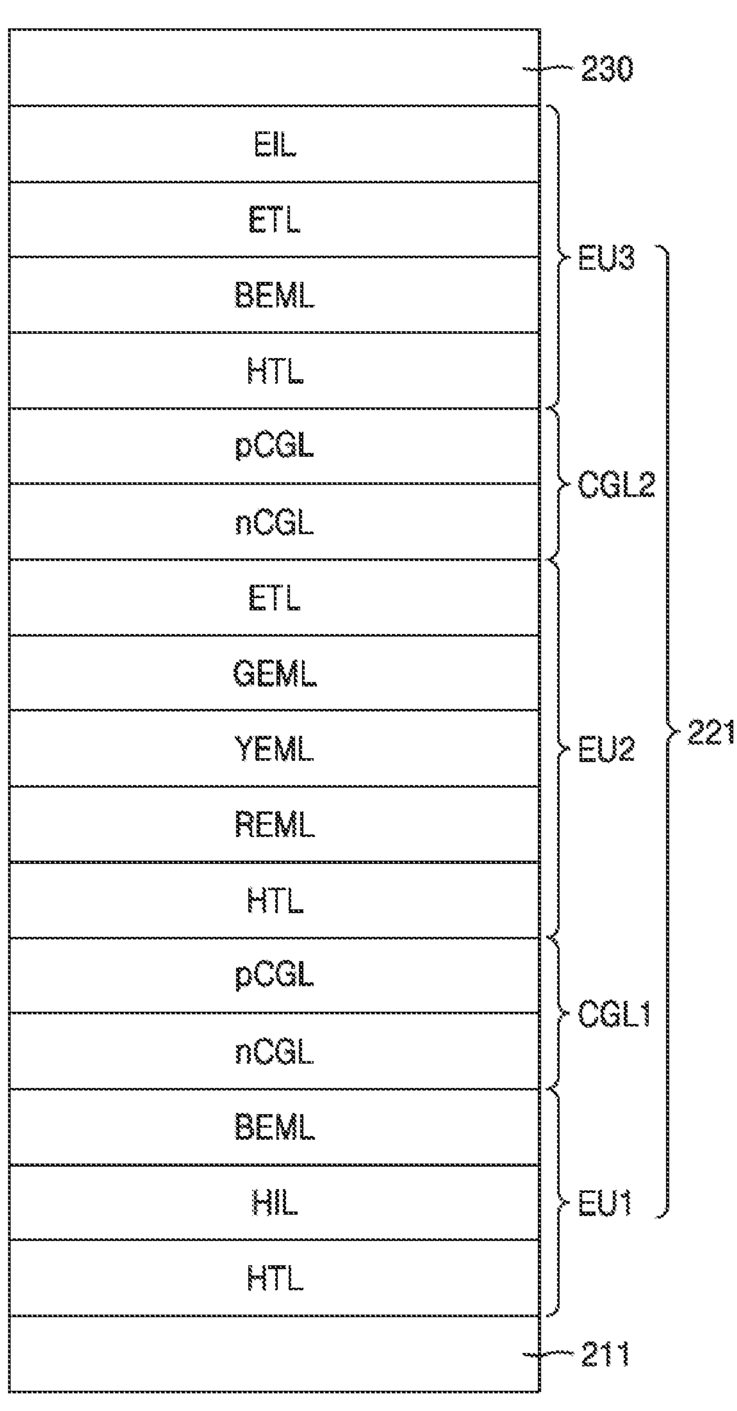
FIG. 26 is a cross-sectional view schematically illustrating an example structure of the display element of FIG. 24.

FIG. 25 is a cross-sectional view schematically illustrating an example structure of the display element of FIG. 23, and FIG. 26 is a cross-sectional view schematically illustrating an example structure of the display element of FIG. 24.

As shown in FIG. 25, the organic light-emitting diode OLED may include a first emitting unit EU1, a second emitting unit EU2, and a third emitting unit EU3, which are sequentially stacked. A first charge generation layer CGL1 may be located between the first emitting unit EU1 and the second emitting unit EU2, and a second charge generation layer CGL2 may be located between the second emitting unit EU2 and the third emitting unit EU3. Each of the first charge generation layer CGL1 and the second charge generation layer CGL2 may include a negative charge generation layer nCGL and a positive charge generation layer pCGL.

The first emitting unit EU1 may include a blue emission layer BEML. The first emitting unit EU1 may further include a hole injection layer HIL and a hole transport layer HTL, which are located between the pixel electrode 211 and the blue emission layer BEML. In one or more embodiments, a p-doped layer may be located between the hole injection layer HIL and the hole transport layer HTL. The p-doped layer may be formed by doping the hole injection layer HIL with a p-type doping material. In one or more embodiments, at least one of a blue light auxiliary layer, an electron blocking layer, and a buffer layer may be located between the blue emission layer BEML and the hole transport layer HTL. The blue light auxiliary layer may increase light emission efficiency of the blue emission layer BEML. The blue light auxiliary layer may increase light emission efficiency of the blue emission layer BEML by adjusting hole charge balance. The electron blocking layer may reduce or prevent injection of electrons into the hole transport layer HTL. The buffer layer may compensate for a resonance distance according to a wavelength of light emitted from an emission layer.

The second emitting unit EU2 may include a yellow emission layer YEML and a red emission layer REML that is located below the yellow emission layer YEML and directly contacts the yellow emission layer YEML. The second emitting unit EU2 may further include a hole transport layer HTL located between the positive charge generation layer pCGL of the first charge generation layer CGL1 and the red emission layer REML, and may further include an electron transport layer ETL located between the yellow emission layer YEML and the negative charge generation layer nCGL of the second charge generation layer CGL2.

The third emitting unit EU3 may include a blue emission layer BEML. The third emitting unit EU3 may further include a hole transport layer HTL located between the positive charge generation layer pCGL of the second charge generation layer CGL2 and the blue emission layer BEML. The third emitting unit EU3 may further include an electron transport layer ETL and an electron injection layer EIL, located between the blue emission layer BEML and the opposite electrode 230. The electron transport layer ETL may include a single layer or multiple layers. In one or more embodiments, at least one of a blue light auxiliary layer, an electron blocking layer, and a buffer layer may be located between the blue emission layer BEML and the hole transport layer HTL. In addition, at least one of a hole blocking layer and a buffer layer may be located between the blue emission layer BEML and the electron transport layer ETL. The hole blocking layer may reduce or prevent hole injection into the electron transport layer ETL.

The organic light-emitting diode OLED shown in FIG. 26 is different from the organic light-emitting diode OLED shown in FIG. 25 in the stacked structure of the second emitting unit EU2, but the other configurations remain the same. As shown in FIG. 26, the second emitting unit EU2 may include a yellow emission layer YEML, a red emission layer REML located below the yellow emission layer YEML and directly contacting the yellow emission layer YEML, and a green emission layer GEML located over the yellow emission layer YEML and directly contacting the yellow emission layer YEML. The second emitting unit EU2 may further include a hole transport layer HTL located between the positive charge generation layer pCGL of the first charge generation layer CGL1 and the red emission layer REML, and an electron transport layer ETL located between the green emission layer GEML and the negative charge generation layer nCGL of the second charge generation layer CGL2.

Figure 27:
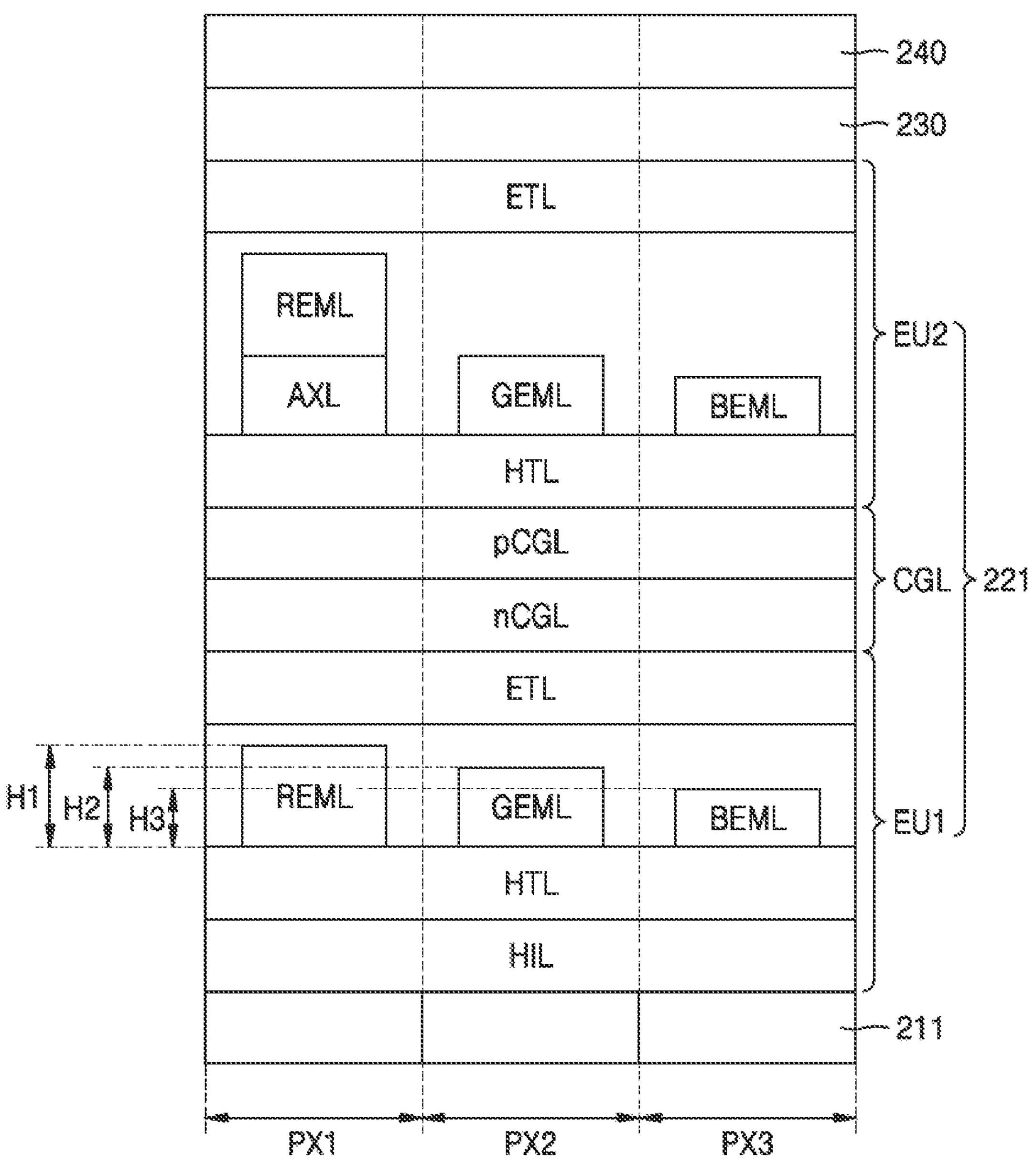
FIG. 27 is a cross-sectional view schematically illustrating a structure of a display element that may be included in a display apparatus according to one or more embodiments.

FIG. 27 is a schematic cross-sectional view illustrating a structure of a display element that may be included in a display apparatus according to one or more embodiments.

As shown in FIG. 27, the display apparatus may include a plurality of pixels. The plurality of pixels may include a first pixel PX1, a second pixel PX2, and a third pixel PX3. Each of the first pixel PX1, the second pixel PX2, and the third pixel PX3 may include a pixel electrode 211, an opposite electrode 230, and an intermediate layer 221. For example, the first pixel PX1 may be a red pixel, the second pixel PX2 may be a green pixel, and the third pixel PX3 may be a blue pixel.

Each of the first pixel PX1, the second pixel PX2, and the third pixel PX3 may include a pixel electrode 211 having an isolated shape. In FIG. 27, pixel electrodes 211 are shown as being in contact with each other. However, this is for convenience only, and adjacent pixel electrodes 211 may be apart from each other.

The intermediate layer 221 of each of the first pixel PX1, the second pixel PX2, and the third pixel PX3 may include a first emitting unit EU1, a second emitting unit EU2, and a charge generation layer CGL, which are sequentially stacked. The charge generation layer CGL, which may be located between the first emitting unit EU1 and the second emitting unit EU2, may include a negative charge generation layer nCGL and a positive charge generation layer pCGL. The charge generation layer CGL may be a common layer integrally formed as a single body with respect to the first pixel PX1, the second pixel PX2, and the third pixel PX3.

The first emitting unit EU1 of the first pixel PX1 may include a hole injection layer HIL, a hole transport layer HTL, a red emission layer REML, and an electron transport layer ETL, which are sequentially stacked on the pixel electrode 211. The first emitting unit EU1 of the second pixel PX2 may include a hole injection layer HIL, a hole transport layer HTL, a green emission layer GEML, and an electron transport layer ETL, which are sequentially stacked on the pixel electrode 211. The first emitting unit EU1 of the third pixel PX3 may include a hole injection layer HIL, a hole transport layer HTL, a blue emission layer BEML, and an electron transport layer ETL, which are sequentially stacked on the pixel electrode 211. Each of the hole injection layer HIL, the hole transport layer HTL, and the electron transport layer ETL of the first emitting unit EU1 may be a common layer integrally formed as a single body with respect to the first pixel PX1, the second pixel PX2, and the third pixel PX3.

The second emitting unit EU2 of the first pixel PX1 may include a hole transport layer HTL, an auxiliary layer AXL, a red emission layer REML, and an electron transport layer ETL, which are sequentially stacked on the charge generation layer CGL. The second emitting unit EU2 of the second pixel PX2 may include a hole transport layer HTL, a green emission layer GEML, and an electron transport layer ETL, which are sequentially stacked on the charge generation layer CGL. The second emitting unit EU2 of the third pixel PX3 may include a hole transport layer HTL, a blue emission layer BEML, and an electron transport layer ETL, which are sequentially stacked on the charge generation layer CGL. Each of the hole transport layer HTL and the electron transport layer ETL of the second emitting unit EU2 may be a common layer integrally formed as a single body with respect to the first pixel PX1, the second pixel PX2, and the third pixel PX3. In one or more embodiments, in the second emitting unit EU2 of the first pixel PX1, the second pixel PX2, and the third pixel PX3, at least one of a hole blocking layer and a buffer layer may be located between an emission layer and the electron transport layer ETL.

A thickness H1 of the red emission layer REML, a thickness H2 of the green emission layer GEML, and a thickness H3 of the blue emission layer BEML may be determined according to a resonance distance. The auxiliary layer AXL is a layer added to adjust the resonance distance and may include a resonance auxiliary material. For example, the auxiliary layer AXL may include the same material as the hole transport layer HTL.

Although FIG. 27 shows that the auxiliary layer AXL is located only in the first pixel PX1, the disclosure is not limited thereto. For example, the auxiliary layer AXL may be located in at least one of the first pixel PX1, the second pixel PX2, and the third pixel PX3 to adjust the resonance distance of at least one of the first pixel PX1, the second pixel PX2, and the third pixel PX3.

The display apparatus may further include a capping layer 240 located outside the opposite electrode 230. The capping layer 240 may improve luminous efficiency by the principle of constructive interference. As a result, the light extraction efficiency of the organic light-emitting diode OLED may increase, and thus, the luminous efficiency of the organic light-emitting diode OLED may be improved.

According to one or more embodiments as described above, a display apparatus having a low occurrence rate of defects due to external impact may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a mask layer having a plurality of openings;

a substrate located below the mask layer and having a plurality of first grooves corresponding to the plurality of openings;

an inorganic insulating layer located on the mask layer and having through holes corresponding to at least some of the plurality of openings; and an organic insulating layer located on the inorganic insulating layer and filling the through holes;
a barrier layer located between the substrate and the inorganic insulating layer; and
a buffer layer located between the barrier layer and the inorganic insulating layer and having second rooves corresponding to the through holes.

2. The display apparatus of claim 1, wherein, when viewed in a direction perpendicular to the substrate, the plurality of openings overlap the plurality of first grooves.

3. The display apparatus of claim 1, wherein the plurality of openings are in one-to-one correspondence with the plurality of first grooves.

4. The display apparatus of claim 1, wherein, when viewed in a direction perpendicular to the substrate, each of the through holes has a shape extending in a major axis direction, and a width of each of the through holes in a minor axis direction crossing the major axis direction is less than a width of a corresponding one of the plurality of first grooves in the minor axis direction.

5. The display apparatus of claim 1, wherein the barrier layer has a constant thickness throughout an entire area.

6. The display apparatus of claim 1, wherein a distance from a bottom surface of each of the second grooves to a bottom surface of the substrate is less than a thickness of the substrate.

7. The display apparatus of claim 1, wherein, in the first grooves, a distance from an upper surface of the buffer layer to a bottom surface of the substrate is less than a thickness of the substrate.

8. The display apparatus of claim 1, wherein, when viewed in a direction perpendicular to the substrate, the second grooves overlap the through holes.

9. The display apparatus of claim 1, wherein the second grooves are in one-to-one correspondence with the through holes.

10. The display apparatus of claim 1, wherein an inner side surface of each of the second grooves and an inner side surface of a corresponding one of the through holes form a continuous surface.

11. The display apparatus of claim 1, wherein the organic insulating layer fills the second grooves.

12. The display apparatus of claim 1, wherein the organic insulating layer contacts a bottom surface of each of the second grooves.

13. The display apparatus of claim 1, wherein the mask layer includes a metal.

14. The display apparatus of claim 1, wherein the mask layer includes an inorganic insulating material.

15. The display apparatus of claim 14, further comprising a bottom metal layer located between the mask layer and the inorganic insulating layer and having a plurality of apertures corresponding to the plurality of openings.

16. The display apparatus of claim 1, further comprising a semiconductor layer located between the mask layer and the inorganic insulating layer and positioned within the mask layer when viewed in a direction perpendicular to the substrate.

17. The display apparatus of claim 1, wherein the display apparatus is one of a smartphone, a tablet computer, a laptop computer, a television, or an advertisement board.

18. A display apparatus comprising:
a mask layer having a plurality of openings;
a substrate located below the mask laver and having a plurality of first rooves corresponding to the plurality of openings;
an inorganic insulating layer located on the mask layer and having through holes corresponding to at least some of the plurality of openings;
an organic insulating laver located on the inorganic insulating laver and filling the through holes; and
a barrier layer located between the mask layer and the inorganic insulating layer, the barrier layer overlapping the mask layer and the plurality of first rooves of the substrate.

19. The display apparatus of claim 18, wherein the barrier layer has a constant thickness in a first portion overlapping the mask layer and in a second portion overlapping the plurality of first grooves of the substrate.

20. A display apparatus comprising:
a mask layer including a metal and having a plurality of openings;
a substrate located below the mask layer and having a plurality of first rooves corresponding to the plurality of openings;
an inorganic insulating layer located on the mask layer and having through holes corresponding to at least some of the plurality of openings;
an organic insulating layer located on the inorganic insulating layer and filling the through holes; and
a bonding layer located between the substrate and the mask layer.

21. The display apparatus of claim 20, wherein the bonding layer includes an inorganic insulating material.

22. The display apparatus of claim 20, wherein the bonding layer includes a plurality of additional openings corresponding to the plurality of openings.

23. The display apparatus of claim 22, wherein, when viewed in a direction perpendicular to the substrate, the plurality of openings overlap the plurality of additional openings.

24. The display apparatus of claim 22, wherein the plurality of openings are in one-to-one correspondence with the plurality of additional openings.

25. The display apparatus of claim 22, wherein an inner side surface of each of the plurality of first grooves, an inner side surface of a corresponding one of the plurality of additional openings, and an inner side surface of a corresponding one of the plurality of openings form a continuous surface.

* * * * *